United States Patent
Thedjoisworo et al.

(10) Patent No.: US 9,514,954 B2
(45) Date of Patent: Dec. 6, 2016

(54) PEROXIDE-VAPOR TREATMENT FOR ENHANCING PHOTORESIST-STRIP PERFORMANCE AND MODIFYING ORGANIC FILMS

(71) Applicant: Lam Research Corporation, Fremont, CA (US)

(72) Inventors: Bayu Atmaja Thedjoisworo, San Jose, CA (US); Bradley Jon Jacobs, East Helena, MT (US); Ivan Berry, San Jose, CA (US); David Cheung, Foster City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/301,155

(22) Filed: Jun. 10, 2014

(65) Prior Publication Data
US 2015/0357202 A1    Dec. 10, 2015

(51) Int. Cl.
*H01L 21/311*  (2006.01)
*H01L 21/67*  (2006.01)

(52) U.S. Cl.
CPC ... *H01L 21/31138* (2013.01); *H01L 21/67069* (2013.01)

(58) Field of Classification Search
CPC .................. H01L 21/31138; H01L 21/67069; H01L 37/3244; H01L 37/32449; H01L 37/32926
See application file for complete search history.

(56) References Cited

U.S. PATENT DOCUMENTS

| | | | |
|---|---|---|---|
| 4,201,579 A | 5/1980 | Robinson et al. |
| 4,357,203 A | 11/1982 | Zelez |
| 4,699,689 A | 10/1987 | Bersin |
| 4,961,820 A | 10/1990 | Shinagawa et al. |
| 5,122,225 A | 6/1992 | Douglas |
| 5,158,644 A | 10/1992 | Cheung et al. |
| 5,292,393 A | 3/1994 | Maydan et al. |
| 5,354,386 A | 10/1994 | Cheung et al. |

(Continued)

FOREIGN PATENT DOCUMENTS

| | | |
|---|---|---|
| CN | 1402316 | 3/2003 |
| CN | 1720349 | 1/2006 |

(Continued)

OTHER PUBLICATIONS

U.S. Appl. No. 13/274,638, filed Oct. 17, 2011, entitled "Photoresist Strip Method for Low-K Dielectrics."

(Continued)

*Primary Examiner* — Duy Deo
(74) *Attorney, Agent, or Firm* — Weaver Austin Villeneuve & Sampson LLP

(57) ABSTRACT

Methods and apparatus for treating an organic film such as photoresist with a hydroxyl-generating compound prior to removing the organic film from a substrate are provided. Treatments include exposure to one or more of hydrogen peroxide vapor and water vapor in a non-plasma environment. In some implementations, conditions are such that condensation on the surface is suppressed. Methods include treating high-dose ion-implantation photoresists and post-plasma doping photoresists with little or no material loss and permit mild plasma removal of the photoresist after treatment.

20 Claims, 8 Drawing Sheets

(56) References Cited

U.S. PATENT DOCUMENTS

| | | | |
|---|---|---|---|
| 5,593,541 A | 1/1997 | Wong et al. | |
| 5,626,678 A | 5/1997 | Sahin et al. | |
| 5,633,073 A | 5/1997 | Cheung et al. | |
| 5,651,860 A * | 7/1997 | Li | G03F 7/42 134/4 |
| 5,660,682 A | 8/1997 | Zhao et al. | |
| 5,707,485 A | 1/1998 | Rolfson et al. | |
| 5,767,021 A | 6/1998 | Imai et al. | |
| 5,773,201 A | 6/1998 | Fujimura et al. | |
| 5,792,269 A | 8/1998 | Deacon et al. | |
| 5,811,358 A | 9/1998 | Tseng et al. | |
| 5,814,155 A | 9/1998 | Solis et al. | |
| 5,817,406 A | 10/1998 | Cheung et al. | |
| 5,820,685 A | 10/1998 | Kurihara et al. | |
| 5,830,775 A | 11/1998 | Maa et al. | |
| 5,844,195 A | 12/1998 | Fairbairn et al. | |
| 5,895,272 A | 4/1999 | Li | |
| 5,900,351 A | 5/1999 | Lutsic et al. | |
| 5,908,672 A | 6/1999 | Ryu et al. | |
| 5,911,834 A | 6/1999 | Fairbairn et al. | |
| 5,968,324 A | 10/1999 | Cheung et al. | |
| 5,980,770 A | 11/1999 | Ramachandran et al. | |
| 6,013,574 A | 1/2000 | Hause et al. | |
| 6,030,901 A | 2/2000 | Hopper et al. | |
| 6,039,834 A | 3/2000 | Tanaka et al. | |
| 6,045,618 A | 4/2000 | Raoux et al. | |
| 6,054,379 A | 4/2000 | Yau et al. | |
| 6,072,227 A | 6/2000 | Yau et al. | |
| 6,077,764 A | 6/2000 | Sugiarto et al. | |
| 6,083,852 A | 7/2000 | Cheung et al. | |
| 6,086,952 A | 7/2000 | Lang et al. | |
| 6,098,568 A | 8/2000 | Raoux et al. | |
| 6,107,184 A | 8/2000 | Mandal et al. | |
| 6,121,091 A | 9/2000 | Wang | |
| 6,125,788 A | 10/2000 | Hills et al. | |
| 6,127,262 A | 10/2000 | Huang et al. | |
| 6,129,091 A | 10/2000 | Lee et al. | |
| 6,130,166 A * | 10/2000 | Yeh | G03F 7/427 257/E21.256 |
| 6,156,149 A | 12/2000 | Cheung et al. | |
| 6,162,323 A | 12/2000 | Koshimizu | |
| 6,171,945 B1 | 1/2001 | Mandal et al. | |
| 6,177,347 B1 | 1/2001 | Liu et al. | |
| 6,184,134 B1 | 2/2001 | Chaudhary et al. | |
| 6,187,072 B1 | 2/2001 | Cheung et al. | |
| 6,193,802 B1 | 2/2001 | Pang et al. | |
| 6,194,628 B1 | 2/2001 | Pang et al. | |
| 6,203,657 B1 | 3/2001 | Collison et al. | |
| 6,204,192 B1 | 3/2001 | Zhao et al. | |
| 6,209,484 B1 | 4/2001 | Huang et al. | |
| 6,230,652 B1 | 5/2001 | Tanaka et al. | |
| 6,242,350 B1 | 6/2001 | Tao et al. | |
| 6,245,690 B1 | 6/2001 | Yau et al. | |
| 6,277,733 B1 | 8/2001 | Smith | |
| 6,281,135 B1 | 8/2001 | Han et al. | |
| 6,287,990 B1 | 9/2001 | Cheung et al. | |
| 6,303,523 B2 | 10/2001 | Cheung et al. | |
| 6,306,564 B1 | 10/2001 | Mullee | |
| 6,319,842 B1 | 11/2001 | Khosla et al. | |
| 6,324,439 B1 | 11/2001 | Cheung et al. | |
| 6,340,435 B1 | 1/2002 | Bjorkman et al. | |
| 6,342,446 B1 | 1/2002 | Smith et al. | |
| 6,348,725 B2 | 2/2002 | Cheung et al. | |
| 6,350,701 B1 | 2/2002 | Yamazaki | |
| 6,352,936 B1 | 3/2002 | Jehoul et al. | |
| 6,358,573 B1 | 3/2002 | Raoux et al. | |
| 6,361,707 B1 | 3/2002 | Tanaka et al. | |
| 6,365,516 B1 | 4/2002 | Frenkel et al. | |
| 6,395,092 B1 | 5/2002 | Sugiarto et al. | |
| 6,413,583 B1 | 7/2002 | Moghadam et al. | |
| 6,426,304 B1 | 7/2002 | Chien et al. | |
| 6,432,830 B1 | 8/2002 | Merry | |
| 6,448,187 B2 | 9/2002 | Yau et al. | |
| 6,465,964 B1 | 10/2002 | Taguchi et al. | |
| 6,511,903 B1 | 1/2003 | Yau et al. | |
| 6,511,909 B1 | 1/2003 | Yau et al. | |
| 6,517,913 B1 | 2/2003 | Cheung et al. | |
| 6,537,422 B2 | 3/2003 | Sakuma et al. | |
| 6,537,929 B1 | 3/2003 | Cheung et al. | |
| 6,541,282 B1 | 4/2003 | Cheung et al. | |
| 6,555,472 B2 | 4/2003 | Aminpur | |
| 6,562,544 B1 | 5/2003 | Cheung et al. | |
| 6,562,690 B1 | 5/2003 | Cheung et al. | |
| 6,569,257 B1 | 5/2003 | Nguyen et al. | |
| 6,593,247 B1 | 7/2003 | Huang et al. | |
| 6,596,655 B1 | 7/2003 | Cheung et al. | |
| 6,632,735 B2 | 10/2003 | Yau et al. | |
| 6,638,875 B2 | 10/2003 | Han et al. | |
| 6,656,832 B1 | 12/2003 | Pan et al. | |
| 6,660,656 B2 | 12/2003 | Cheung et al. | |
| 6,660,663 B1 | 12/2003 | Cheung et al. | |
| 6,663,715 B1 | 12/2003 | Yuda et al. | |
| 6,667,244 B1 | 12/2003 | Cox et al. | |
| 6,669,858 B2 | 12/2003 | Bjorkman et al. | |
| 6,680,164 B2 | 1/2004 | Nguyen et al. | |
| 6,680,420 B2 | 1/2004 | Pang et al. | |
| 6,689,930 B1 | 2/2004 | Pang et al. | |
| 6,693,043 B1 | 2/2004 | Li et al. | |
| 6,709,715 B1 | 3/2004 | Lang et al. | |
| 6,720,132 B2 | 4/2004 | Tsai et al. | |
| 6,730,593 B2 | 5/2004 | Yau et al. | |
| 6,734,115 B2 | 5/2004 | Cheung et al. | |
| 6,743,737 B2 | 6/2004 | Yau et al. | |
| 6,764,940 B1 | 7/2004 | Rozbicki et al. | |
| 6,770,556 B2 | 8/2004 | Yau et al. | |
| 6,777,173 B2 | 8/2004 | Chen et al. | |
| 6,787,452 B2 | 9/2004 | Sudijono et al. | |
| 6,797,188 B1 | 9/2004 | Shen et al. | |
| 6,800,571 B2 | 10/2004 | Cheung et al. | |
| 6,806,207 B2 | 10/2004 | Huang et al. | |
| 6,837,967 B1 | 1/2005 | Berman et al. | |
| 6,848,455 B1 | 2/2005 | Shrinivasan et al. | |
| 6,858,153 B2 | 2/2005 | Bjorkman et al. | |
| 6,869,896 B2 | 3/2005 | Cheung et al. | |
| 6,900,135 B2 | 5/2005 | Somekh et al. | |
| 6,902,682 B2 | 6/2005 | Shang et al. | |
| 6,930,061 B2 | 8/2005 | Cheung et al. | |
| 7,023,092 B2 | 4/2006 | Yau et al. | |
| 7,070,657 B1 | 7/2006 | Cheung et al. | |
| 7,074,298 B2 | 7/2006 | Gondhalekar et al. | |
| 7,160,821 B2 | 1/2007 | Huang et al. | |
| 7,186,648 B1 | 3/2007 | Rozbicki et al. | |
| 7,202,176 B1 | 4/2007 | Goto et al. | |
| 7,205,249 B2 | 4/2007 | Cheung et al. | |
| 7,227,244 B2 | 6/2007 | Bjorkman et al. | |
| 7,256,134 B2 | 8/2007 | Kim et al. | |
| 7,288,484 B1 | 10/2007 | Goto et al. | |
| 7,297,635 B2 | 11/2007 | Toda et al. | |
| 7,344,993 B2 | 3/2008 | Balasubramaniam et al. | |
| 7,390,755 B1 | 6/2008 | Chen et al. | |
| 7,432,209 B2 | 10/2008 | Delgadino et al. | |
| 7,465,680 B2 | 12/2008 | Chen et al. | |
| 7,468,326 B2 | 12/2008 | Chen et al. | |
| 7,556,712 B2 | 7/2009 | Yi et al. | |
| 7,560,377 B2 | 7/2009 | Cheung et al. | |
| 7,569,492 B1 | 8/2009 | Chen et al. | |
| 7,585,777 B1 | 9/2009 | Goto et al. | |
| 7,595,005 B2 | 9/2009 | Balasubramaniam | |
| 7,597,816 B2 | 10/2009 | Chang et al. | |
| 7,601,272 B2 | 10/2009 | Nguyen et al. | |
| 7,628,864 B2 | 12/2009 | Moriya et al. | |
| 7,651,949 B2 | 1/2010 | Jo | |
| 7,740,768 B1 | 6/2010 | Goto et al. | |
| 7,799,685 B2 | 9/2010 | Savas | |
| 8,034,176 B2 | 10/2011 | Tsukamoto et al. | |
| 8,058,178 B1 | 11/2011 | Goto et al. | |
| 8,058,181 B1 | 11/2011 | Chen et al. | |
| 8,097,527 B2 | 1/2012 | Yang | |
| 8,129,281 B1 | 3/2012 | Cheung et al. | |
| 8,173,547 B2 | 5/2012 | Winniczek et al. | |
| 8,193,096 B2 | 6/2012 | Goto et al. | |
| 8,435,895 B2 | 5/2013 | Chen et al. | |
| 8,444,869 B1 | 5/2013 | Goto et al. | |
| 8,591,661 B2 | 11/2013 | Cheung et al. | |

(56) References Cited

U.S. PATENT DOCUMENTS

| | | |
|---|---|---|
| 8,598,037 B2 | 12/2013 | Winniczek et al. |
| 8,641,862 B2 | 2/2014 | Goto et al. |
| 8,716,143 B1 | 5/2014 | Cheung et al. |
| 8,721,797 B2 | 5/2014 | Cheung et al. |
| 9,373,497 B2 | 6/2016 | Chen et al. |
| 2001/0014529 A1 | 8/2001 | Chen et al. |
| 2001/0027023 A1 | 10/2001 | Ishihara |
| 2002/0000202 A1 | 1/2002 | Yuda et al. |
| 2002/0005392 A1 | 1/2002 | Luo et al. |
| 2002/0039625 A1 | 4/2002 | Powell et al. |
| 2002/0045331 A1 | 4/2002 | Aminpur |
| 2002/0072016 A1 | 6/2002 | Chen et al. |
| 2002/0078976 A1 | 6/2002 | Nguyen |
| 2002/0081854 A1 | 6/2002 | Morrow et al. |
| 2002/0090827 A1 | 7/2002 | Yokoshima |
| 2002/0111041 A1 | 8/2002 | Annapragada et al. |
| 2002/0132486 A1 | 9/2002 | Williams et al. |
| 2002/0139775 A1 | 10/2002 | Chang et al. |
| 2002/0151156 A1* | 10/2002 | Hallock .................. G03F 7/42 438/531 |
| 2002/0153099 A1 | 10/2002 | Wang et al. |
| 2002/0185151 A1 | 12/2002 | Qingyuan et al. |
| 2002/0185226 A1 | 12/2002 | Lea et al. |
| 2002/0187643 A1 | 12/2002 | Gu et al. |
| 2002/0197870 A1 | 12/2002 | Johnson |
| 2003/0036284 A1 | 2/2003 | Chou et al. |
| 2003/0045115 A1 | 3/2003 | Fang |
| 2003/0045131 A1 | 3/2003 | Verbeke et al. |
| 2004/0084412 A1 | 5/2004 | Waldfried et al. |
| 2004/0209469 A1 | 10/2004 | Harada et al. |
| 2004/0237997 A1 | 12/2004 | Rui et al. |
| 2004/0245091 A1 | 12/2004 | Karim et al. |
| 2004/0248414 A1 | 12/2004 | Tsai et al. |
| 2005/0022839 A1 | 2/2005 | Savas et al. |
| 2005/0026430 A1 | 2/2005 | Kim et al. |
| 2005/0079723 A1 | 4/2005 | Niimi et al. |
| 2005/0106888 A1 | 5/2005 | Chiu et al. |
| 2005/0158667 A1 | 7/2005 | Nguyen et al. |
| 2005/0196967 A1 | 9/2005 | Savas et al. |
| 2006/0046482 A1 | 3/2006 | Verhaverbeke |
| 2006/0051881 A1 | 3/2006 | Ditizio |
| 2006/0102197 A1 | 5/2006 | Chiang et al. |
| 2006/0138399 A1 | 6/2006 | Itano et al. |
| 2006/0141758 A1 | 6/2006 | Naumann et al. |
| 2006/0154471 A1 | 7/2006 | Minami |
| 2006/0163202 A1 | 7/2006 | Shimitz |
| 2006/0182875 A1 | 8/2006 | Ose et al. |
| 2006/0191478 A1 | 8/2006 | Gondhalekar et al. |
| 2006/0201623 A1 | 9/2006 | Yoo |
| 2006/0289384 A1 | 12/2006 | Pavel et al. |
| 2007/0037396 A1 | 2/2007 | Verhaverbeke |
| 2007/0040172 A1 | 2/2007 | Kawakami et al. |
| 2007/0068900 A1 | 3/2007 | Kim et al. |
| 2007/0144673 A1 | 6/2007 | Yeom |
| 2007/0173066 A1 | 7/2007 | Kokura et al. |
| 2007/0178698 A1 | 8/2007 | Okita et al. |
| 2007/0224826 A1 | 9/2007 | Delgadino et al. |
| 2007/0235137 A1 | 10/2007 | Tsukamoto et al. |
| 2007/0281491 A1 | 12/2007 | Kamp |
| 2008/0026589 A1 | 1/2008 | Hubacek et al. |
| 2008/0044995 A1 | 2/2008 | Kang et al. |
| 2008/0102646 A1 | 5/2008 | Kawaguchi et al. |
| 2008/0160729 A1 | 7/2008 | Krueger et al. |
| 2008/0248656 A1 | 10/2008 | Chen et al. |
| 2008/0286697 A1 | 11/2008 | Verhaverbeke et al. |
| 2009/0053901 A1 | 2/2009 | Goto et al. |
| 2009/0056875 A1 | 3/2009 | Goto et al. |
| 2009/0061623 A1 | 3/2009 | Chang et al. |
| 2009/0117746 A1 | 5/2009 | Masuda |
| 2009/0200268 A1 | 8/2009 | Tappan et al. |
| 2009/0221148 A1 | 9/2009 | Uda et al. |
| 2009/0277472 A1 | 11/2009 | Rivkin et al. |
| 2009/0277871 A1 | 11/2009 | Berry et al. |
| 2010/0015812 A1 | 1/2010 | Nishikawa |
| 2010/0062591 A1 | 3/2010 | Lin et al. |
| 2010/0130017 A1 | 5/2010 | Luo et al. |
| 2010/0216312 A1* | 8/2010 | Yamamoto ........ H01L 21/31138 438/725 |
| 2010/0308463 A1 | 12/2010 | Yu et al. |
| 2011/0006034 A1 | 1/2011 | Hilkene et al. |
| 2011/0031493 A1 | 2/2011 | Yamazaki et al. |
| 2011/0139175 A1 | 6/2011 | Cheung et al. |
| 2011/0139176 A1 | 6/2011 | Cheung et al. |
| 2011/0143548 A1 | 6/2011 | Cheung et al. |
| 2011/0223756 A1 | 9/2011 | Schaeffer |
| 2012/0211462 A1 | 8/2012 | Zhang et al. |
| 2012/0211473 A1 | 8/2012 | Goto et al. |
| 2013/0048014 A1 | 2/2013 | Shaviv et al. |
| 2013/0157465 A1 | 6/2013 | Chen et al. |
| 2014/0080309 A1 | 3/2014 | Park et al. |
| 2014/0120733 A1 | 5/2014 | Cheung et al. |
| 2014/0182619 A1 | 7/2014 | Goto et al. |
| 2015/0332933 A1 | 11/2015 | Cheung et al. |

FOREIGN PATENT DOCUMENTS

| | | |
|---|---|---|
| CN | 1815697 A | 8/2006 |
| CN | 1868043 | 11/2006 |
| CN | 101015042 | 8/2007 |
| CN | 101057314 A | 10/2007 |
| CN | 101131928 | 2/2008 |
| EP | 0 304 068 | 2/1989 |
| EP | 1 077 476 | 2/2001 |
| EP | 1 081 754 | 7/2001 |
| EP | 1 956 638 | 8/2008 |
| GB | 2300303 A | 10/1996 |
| JP | H01-200628 | 8/1989 |
| JP | H05-275326 | 10/1993 |
| JP | H06-208972 | 7/1994 |
| JP | H08-293487 | 11/1996 |
| JP | H09-36099 | 2/1997 |
| JP | H11-087307 A | 3/1999 |
| JP | 2000-286248 A | 10/2000 |
| JP | 2001-189305 A | 7/2001 |
| JP | 2001-308078 | 11/2001 |
| JP | 2003-100718 | 4/2003 |
| JP | 2003-264170 | 9/2003 |
| JP | 2005-268312 A | 9/2005 |
| JP | 2006-073612 | 3/2006 |
| JP | 2006-351594 | 12/2006 |
| JP | 2007-019367 | 1/2007 |
| JP | 2007-53344 | 3/2007 |
| JP | 2007-109744 A | 4/2007 |
| JP | 2007-515781 A | 6/2007 |
| JP | 2007-266610 | 10/2007 |
| JP | 2008-218997 | 9/2008 |
| KR | 10-2004-0103073 | 12/2004 |
| TW | 387097 | 4/2000 |
| TW | 200535277 | 11/2005 |
| WO | WO 2004/051702 | 6/2004 |
| WO | WO 2004/102640 | 11/2004 |
| WO | WO 2005/017983 | 2/2005 |
| WO | WO 2006/028858 | 3/2006 |
| WO | WO 2011/071980 | 6/2011 |
| WO | WO 2011/072042 | 6/2011 |
| WO | WO 2011/072061 | 6/2011 |
| WO | WO 2012/018375 | 2/2012 |

OTHER PUBLICATIONS

US Office Action, dated Jul. 27, 2005, issued in U.S. Appl. No. 10/890,653.

US Final Office Action, dated Jan. 10, 2006, issued in U.S. Appl. No. 10/890,653.

US Office Action, dated Jun. 26, 2006, issued in U.S. Appl. No. 10/890,653.

US Office Action, dated Oct. 11, 2006, issued in U.S. Appl. No. 10/890,653.

US Office Action, dated Apr. 5, 2007, issued in U.S. Appl. No. 10/890,653.

US Notice of Allowance, dated Jun. 15, 2007, issued in U.S. Appl. No. 10/890,653.

(56) References Cited

OTHER PUBLICATIONS

US Supplemental Notice of Allowance, dated Jul. 23, 2007, issued in U.S. Appl. No. 10/890,653.
US Office Action, dated Oct. 6, 2008, issued in U.S. Appl. No. 11/859,727.
US Notice of Allowance, dated May 1, 2009, issued in U.S. Appl. No. 11/859,727.
US Office Action, dated Nov. 5, 2010, issued in U.S. Appl. No. 12/533,461.
US Final Office Action, dated May 26, 2011, issued in U.S. Appl. No. 12/533,461.
US Notice of Allowance, dated Aug. 12, 2011, issued in U.S. Appl. No. 12/533,461.
US Office Action dated Feb. 15, 2013, U.S. Appl. No. 13/274,638.
US Notice of Allowance, dated Nov. 28, 2006, issued in U.S. Appl. No. 11/011,273.
US Office Action, dated Dec. 23, 2008, issued in U.S. Appl. No. 11/712,253.
US Office Action, dated Jul. 17, 2009, issued in U.S. Appl. No. 11/712,253.
US Final Office Action, dated Jan. 29, 2010, issued in U.S. Appl. No. 11/712,253.
US Office Action, dated Mar. 1, 2011, issued in U.S. Appl. No. 11/712,253.
US Office Action, dated Nov. 2, 2011, issued in U.S. Appl. No. 12/251,305.
US Notice of Allowance, dated Feb. 17, 2012, issued in U.S. Appl. No. 12/251,305.
US Office Action, dated Apr. 26, 2013, issued in U.S. Appl. No. 13/462,660.
US Notice of Allowance, dated Sep. 30, 2013, issued in U.S. Appl. No. 13/462,660.
US Notice of Allowance, dated Dec. 31, 2013, issued in U.S. Appl. No. 13/462,660.
US Office Action, dated Jul. 11, 2003, issued in U.S. Appl. No. 10/137,096.
US Final Office Action, dated Jul. 27, 2007, issued in U.S. Appl. No. 10/137,096.
US Notice of Allowance, dated Jan. 15, 2008, issued in U.S. Appl. No. 10/137,096.
US Office Action, dated Aug. 25, 2008, issued in U.S. Appl. No. 12/111,095.
US Notice of Allowance, dated Apr. 3, 2009, issued in U.S. Appl. No. 12/111,095.
US Office Action, dated Dec. 8, 2010, issued in U.S. Appl. No. 12/502,130.
US Notice of Allowance, dated Aug. 12, 2011, issued in U.S. Appl. No. 12/502,130.
US Office Action, dated Sep. 6, 2012, issued in U.S. Appl. No. 12/636,582.
US Final Office Action, dated May 13, 2013, issued in U.S. Appl. No. 12/636,582.
US Advisory Action Before the Filing of an Appeal Brief, dated Sep. 20, 2013, issued in U.S. Appl. No. 12/636,582.
US Office Action, dated Dec. 4, 2013, issued in U.S. Appl. No. 12/636,582.
US Office Action, dated Aug. 13, 2014, issued in U.S. Appl. No. 12/636,582.
US Office Action, dated Mar. 30, 2012, issued in U.S. Appl. No. 12/636,601.
US Final Office Action, dated Sep. 5, 2012, issued in U.S. Appl. No. 12/636,601.
US Office Action, dated Feb. 12, 2013, issued in U.S. Appl. No. 12/636,601.
US Notice of Allowance, dated Jul. 23, 2013, issued in U.S. Appl. No. 12/636,601.
US Supplemental Notice of Allowability, dated Nov. 5, 2013, issued in U.S. Appl. No. 12/636,601.
US Office Action, dated Apr. 10, 2014, issued in U.S. Appl. No. 14/066,587.
US Office Action, dated Jul. 27, 2012, issued in U.S. Appl. No. 12/963,503.
US Final Office Action, dated Jan. 22, 2013, issued in U.S. Appl. No. 12/963,503.
US Office Action, dated Aug. 23, 2013, issued in U.S. Appl. No. 12/963,503.
US Notice of Allowance, dated Feb. 12, 2014, issued in U.S. Appl. No. 12/963,503.
US Notice of Allowance, dated Feb. 17, 2010, issued in U.S. Appl. No. 11/548,801.
US Office Action, dated Nov. 10, 2011, U.S. Appl. No. 12/786,230.
US Final Office Action, dated Apr. 26, 2012, issued in U.S. Appl. No. 12/786,230.
US Notice of Allowance dated Jan. 24, 2013, issued in U.S. Appl. No. 12/786,230.
US Office Action, dated Sep. 13, 2006, issued in U.S. Appl. No. 11/128,930.
US Final Office Action, dated Mar. 8, 2007, issued in U.S. Appl. No. 11/128,930.
US Office Action, dated Mar. 19, 2007, issued in U.S. Appl. No. 11/128,930.
US Office Action, dated Jun. 29, 2007, issued in U.S. Appl. No. 11/128,930.
US Office Action, Dec. 10, 2007, issued in U.S. Appl. No. 11/128,930 dated.
US Final Office Action, dated Jul. 21, 2008, issued in U.S. Appl. No. 11/128,930.
US Office Action, dated Mar. 20, 2009, issued in U.S. Appl. No. 11/128,930.
US Office Action, dated Sep. 17, 2009, issued in U.S. Appl. No. 11/128,930.
US Office Action, dated Feb. 26, 2010, issued in U.S. Appl. No. 11/128,930.
US Final Office Action, dated Sep. 9, 2010, issued in U.S. Appl. No. 11/128,930.
US Office Action, dated May 10, 2011, issued in U.S. Appl. No. 11/128,930.
US Notice of Allowance, dated Oct. 28, 2011, issued in U.S. Appl. No. 11/128,930.
US Office Action dated Feb. 22, 2013, issued in U.S. Appl. No. 13/370,689.
US Final Office Action dated Aug. 20, 2013, issued in U.S. Appl. No. 13/370,689.
US Notice of Allowance dated Jan. 17, 2014, issued in U.S. Appl. No. 13/370,689.
US Office Action, dated Dec. 15, 2009, issued in U.S. Appl. No. 11/696,633.
US Office Action, dated May 26, 2010, issued in U.S. Appl. No. 11/696,633.
US Final Office Action, dated Sep. 20, 2010, issued in U.S. Appl. No. 11/696,633.
US Office Action, dated Jun. 6, 2011, issued in U.S. Appl. No. 11/696,633.
US Final Office Action, dated Sep. 28, 2011, issued in U.S. Appl. No. 11/696,633.
US Office Action, dated Jan. 27, 2012, issued in U.S. Appl. No. 11/696,633.
US Final Office Action, dated May 15, 2012, issued in U.S. Appl. No. 11/696,633.
US Notice of Allowance, dated Oct. 29, 2012, issued in U.S. Appl. No. 11/696,633.
US Office Action, dated Jul. 19, 2013, issued in U.S. Appl. No. 13/759,958.
US Final Office Action, dated Nov. 12, 2013, issued in U.S. Appl. No. 13/759,958.
US Notice of Allowance, dated Apr. 28, 2014, issued in U.S. Appl. No. 13/759,958.
US Notice of Allowance, dated Sep. 22, 2014, issued in U.S. Appl. No. 13/759,958.
Chinese Office Action dated Jul. 20, 2012, issued in Application No. 200810187894.4.
Chinese Office Action dated Jun. 19, 2013, issued in Application No. 200810187894.4.

(56) References Cited

OTHER PUBLICATIONS

Japanese Office Action dated Sep. 25, 2012, issued in Application No. 2009-018046.
Japanese Description of details of Reasons for Rejection dated Oct. 9, 2012, issued in Application No. 2009-018046.
Japanese Summary of Reasons for Rejection dated Sep. 3, 2013, issued in Application No. 2009-018046.
Taiwan Search Report dated Feb. 17, 2014 issued in TW 097146496.
Taiwan Office Action dated Jun. 19, 2014 issued in TW 097146496.
PCT International Search Report and Written Opinion, dated Jun. 27, 2011, issued in Application No. PCT/US2010/059388.
PCT International Preliminary Report on Patentability and Written Opinion, dated Jun. 21, 2012, issued in Application No. PCT/US2010/059388.
Singapore Written Opinion and Search Report, dated Feb. 2, 2012, issued in Application No. 201104086-2.
Singapore Second Written Opinion, dated Aug. 17, 2012, issued in Application No. 201104086-2.
PCT International Search Report and Written Opinion, dated Jul. 14, 2011, issued in Application No. PCT/US2010/059517.
PCT International Preliminary Report on Patentability and Written Opinion, dated Jun. 21, 2012, issued in Application No. PCT/US2010/059517.
Chinese First Office Action and Search Report dated Aug. 5, 2014 issued in CN 201080056102.5.
Singapore Written Opinion, dated Jul. 15, 2013, issued in Application No. 201204092-9.
Singapore Examination Report, dated Mar. 21, 2014, issued in Application No. 201204092-9.
PCT International Search Report and Written Opinion, dated Jul. 13, 2011, issued in Application No. PCT/US2010/059547.
PCT International Preliminary Report on Patentability and Written Opinion, dated Jun. 21, 2012, issued in Application No. PCT/US2010/059547.
Chinese First Office Action and Search Report dated Sep. 1, 2014 issued in CN 201080055428.6.
Singapore Written Opinion dated Aug. 1, 2013 issued in Application No. 201203361-9.
Singapore Second Written Opinion dated Apr. 5, 2014 issued in Application No. 201203361-9.
European Partial Search Report dated Apr. 17, 2013 issued in Application No. 12 18 1659.
European Partial Search Report dated Aug. 19, 2013 issued in Application No. 12 18 1659.
Singapore Search Report and Written Opinion dated Dec. 13, 2013 issued in SG 201206236-0.
Singapore Search and Examination Report dated Jul. 7, 2014, 2014 issued in SG 201206236-0.
Abe et al. (Aug. 2003) "Novel photoresist stripping technology using ozone/vaporized water mixture," IEEE Trans. Semicon. Manufact., 16(3):401-408.
Anderson et al. (2004) "Carbon Kinetic Isotope Effects in the Gas Phase Reactions of Light Alkanes and Ethene with the OH Radical at 296 ± 4 K," J. Phys. Chem. A, 108:11537-11544.
Aschmann et al. (2008) "Rate constants for the gas-phase reactions of OH radicals with E-7-tetradecene, 2-methyl-l-tridecene and the C7-C14 1-alkenes at 295 ± 1 K," Phys. Chem. Chem. Phys., 10:4159-4164 [Downloaded by LAM Research Corporation on May 4, 2014].
Atkinson et al. (2003) "Atmospheric Degradation of Volatile Organic Compounds," Chem Rev., 103(12):4605-4638.
Chung Woody K., (1990) "Downstream Plasma Removal of Mobile Ion Impurity From SIO2," Published Proceedings of the 8th International Plasma Processing SymposiuM, Fall, 7 pages.
Chung, Woody K., (1989) "Low Damage, Downstream RF Plasma Ashing of High Energy, Heavily Doped Implanted Resists," Semicon Korea, Branson International Plasma Corporation, Hayward, California 94544 U.S.A., 11pp.

De Gendt et al. (1999) "A Novel Resist and Post-Etch Residue Removal Process Using Ozonated Chemistry," Solid State Phenomena vols. 65-66:165-168.
Dibble, Theodore S. (2004) "Intramolecular Hydrogen Bonding and Double H-Atom Transfer in Peroxy and Alkoxy Radicals from Isoprene," J. Phys. Chem. A, 108(12):2199-2207.
Ghandhi, Sorab K., (1983) "VLSI Fabrication Principles," by John Wiley & Sons, Inc., pp. 517-520.
Jones, Craig W. (Jan. 1, 1999) "Introduction to the Preparation and Properties of Hydrogen Peroxide," Applications of Hydrogen Peroxide and Derivatives, The Royal Society of Chemistry, Chapter 1, 36 pp.
Kalnitsky A. and Chung W. K, "Characterization and Optimization of a Single Wafer Downstream Plasma Stripper," Journal of the Electrochemical Society, 135(9):2338-2341.
Kikuchi et al. (Apr. 1994) "Native Oxide Removal on Si Surfaces by NF3-Added Hydrogen and Water Vapor Plasma Downstream Treatment," Jpn J. Appl. Phys. 33:2207-2211, Part 1, No. 4B.
Nishino et al. (2009) "Rate Constants for the Gas-Phase Reactions of OH Radicals with a Series of C6-C14 Alkenes at 299 ± 2 K," J. Phys. Chem. A, 113(5):852-857.
Noda et al. (2003) "Development of a Photoresist Removal Method Using Ozone Gas with Water Vapor for LCD Manufacturing," J. Electrochem. Soc. 150(9):G537-G542.
Orlando et al. (2000) "Chemistry of the Cyclopentoxy and Cyclohexoxy Radicals at Subambient Temperatures," J. Phys. Chem. A, 104:5072-5079.
Peeters, J. (2007) "Structure-Activity Relationship for the Addition of OH to (Poly)alkenes: Site-Specific and Total Rate Constants," J. Phys. Chem A, 111(9):1618-1631.
Vereecken et al. (2004) "Nontraditional (Per)oxy Ring-Closure Paths in the Atmospheric Oxidation of Isoprene and Monoterpenes," J. Phys. Chem. A, 108(24):5197-5204.
Wilson, William E., Jr. (1972) "A Critical Review of the Gas-Phase Reaction Kinetics of the Hydroxyl Radical," J. Phys. Chem. Ref. Data, 1(2):535-574.
Wolf S. and Tauber R.N., (1986) (Silicon Processing for the VLSI Era, vol. 1—Process Technology, Lattice Press), pp. 539-543.
US Final Office Action, dated Feb. 26, 2015, issued in U.S. Appl. No. 12/636,582.
US Final Office Action, dated Oct. 9, 2014, issued in U.S. Appl. No. 14/066,587.
US Office Action, dated Mar. 18, 2015, issued in U.S. Appl. No. 14/066,587.
US Final Office Action, dated Jul. 10, 2015, issued in U.S. Appl. No. 14/066,587.
US Office Action dated Oct. 9, 2014, issued in U.S. Appl. No. 13/590,083.
US Final Office Action dated Apr. 27, 2015, issued in U.S. Appl. No. 13/590,083.
US Office Action dated Sep. 4, 2015, issued in U.S. Appl. No. 13/590,083.
Korean Office Action dated Feb. 25, 2015, issued in Application No. 2008-0116792.
Korean Office Action (Final Rejection) dated Sep. 8, 2015, issued in Application No. 2008-0116792.
Chinese First Office Action dated Sep. 24, 2014 issued in CN Application No. 201080056124.1.
Chinese Second Office Action dated Jun. 3, 2015 issued in CN Application No. 201080056124.1.
Japanese Office Action dated Nov. 11, 2014 issued in JP 2012-543229.
Japanese Office Action (Notice of Reasons for Rejection) dated Sep. 1, 2015 issued in JP 2012-543229.
Chinese Second Office Action and Search Report dated Feb. 13, 2015 issued in CN 201080056102.5.
Japanese Office Action dated Nov. 11, 2014 issued in JP 2012-543254.
Taiwan Office Action dated Mar. 23, 2015, issued in Application No. 099143368.
Taiwan Office Action [Decision] dated Jul. 14, 2015, issued in Application No. 099143368.

(56) References Cited

OTHER PUBLICATIONS

Chinese Second Office Action dated Jun. 23, 2015 issued in CN 201080055428.6.
Japanese Office Action dated Oct. 28, 2014 issued in JP 2012-543261.
Singapore Final Examination Report dated Nov. 3, 2014 issued in Application No. 201203361-9.
Taiwan Office Action dated Jun. 16, 2015 issued in Application No. 099143366.
US Office Action, dated Sep. 16, 2015, issued in U.S. Appl. No. 14/721,977.
Korean Office Action [no translation] dated Nov. 19, 2015, issued in Application No. 2008-0116792.
Chinese Third Office Action dated Dec. 10, 2015 issued in CN Application No. 201080056124.1.
Taiwan Office Action and Search Report, dated Nov. 20, 2015, issued in TW 099143367.
Chinese Third Office Action dated Sep. 28, 2015 issued in CN 201080056102.5.
Japanese Office Action [Decision of Rejection] dated Sep. 8, 2015 issued in JP 2012-543254.
US Final Office Action, dated May 13, 2016, issued in U.S. Appl. No. 14/721,977.
US Final Office Action dated Jan. 25, 2016, issued in U.S. Appl. No. 13/590,083.
US Office Action dated Jun. 8, 2016, issued in U.S. Appl. No. 13/590,083.
Korean Office Action dated Nov. 19, 2015, issued in Application No. 2008-0116792.
Chinese Fourth Office Action dated Jun. 14, 2016 issued in CN Application No. 201080056124.1.
Chinese Third Office Action dated Jan. 4, 2016 issued in CN 201080055428.6.
Chinese Fourth Office Action dated Apr. 5, 2016 issued in CN 201080055428.6.

\* cited by examiner

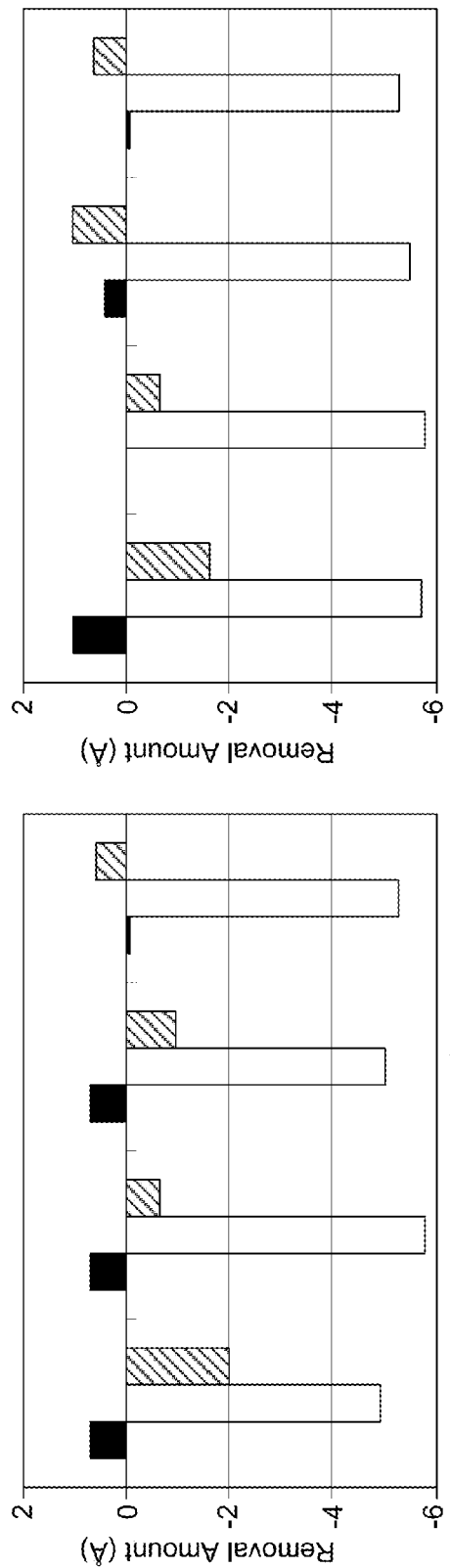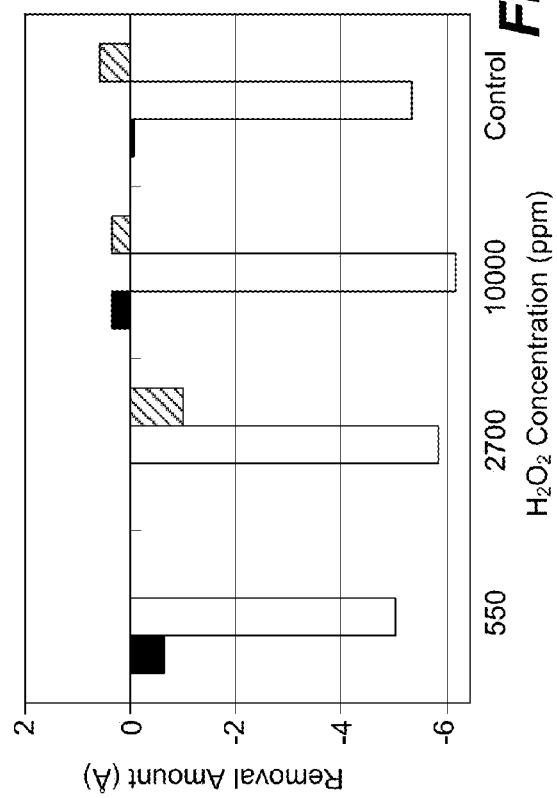
FIG. 8A
FIG. 8B
FIG. 8C

PEROXIDE-VAPOR TREATMENT FOR ENHANCING PHOTORESIST-STRIP PERFORMANCE AND MODIFYING ORGANIC FILMS

BACKGROUND

In many semiconductor fabrication processes, photoresist is used to pattern layers on a substrate. A photoresist-coated surface of a substrate is exposed to a pattern of high energy radiation and portions of the photoresist are removed to reveal the surface below. The surfaces below may undergo etching processes, film deposition, ion-implantation, or other processes while the remaining photoresist acts as a mask. After one or more such operations, the remaining photoresist is removed. These operations can also affect the remaining photoresist, creating removal challenges. For example, the removal of photoresists after ion implantation can be challenging.

SUMMARY

Methods for treating an organic film prior to removal are provided. One aspect of the disclosure involves a method of removing an organic film from a substrate by exposing the organic film to hydrogen peroxide vapor to modify the organic film under non-plasma conditions; and, after exposing the organic film to the hydrogen peroxide vapor, exposing the organic film to a plasma to remove the organic film. The plasma may be substantially fluorine-free in some embodiments.

In various embodiments, the substrate generally includes one or more exposed surfaces having no organic film thereon. In some embodiments, the exposure to the hydroxyl-generating gases results in substantially no material loss from the one or more exposed surfaces. In some embodiments, the organic film is photoresist. In some embodiments, the exposure chemically and/or physically modifies the photoresist. In some embodiments, the photoresist includes bulk photoresist encapsulated by a crust, which has properties different from the bulk photoresist. In some embodiments, the photoresist includes bulk photoresist encapsulated by a crust, which is denser than the bulk photoresist. The photoresist may be an ion-implanted photoresist.

Another aspect of the disclosure involves a method of removing an organic film by exposing a substrate with the organic film thereon to one or more hydroxyl-generating gases under conditions that prevent or suppress condensation of the one or more hydroxyl-generating gases to generate hydroxyl groups that chemically or physically modify the organic film and thereby treat the organic film, such that the exposure is performed prior to removing the organic film. Examples of hydroxyl-generating gases include hydrogen peroxide vapor, or water vapor, and a mixture of hydrogen peroxide vapor and water vapor.

In various embodiments, after treating the organic film, the substrate is exposed to a plasma to thereby remove the organic film. In some embodiments, the plasma is substantially fluorine-free. In some embodiments, the plasma is generated from forming gas.

The substrate having the organic film thereon generally includes one or more exposed surfaces having no organic film thereon. The exposure to the hydroxyl-generating gases may result in substantially no material loss from these exposed surfaces. The method may further include exposing the one or more hydroxyl-generating gases to an activation energy source such as ultra-violet radiation. Exposure to ultra-violet radiation may occur in or upstream of a chamber housing the substrate.

In various embodiments, the organic film is photoresist. In some embodiments, the photoresist includes bulk photoresist encapsulated by a crust, which has properties different from the bulk photoresist. In various embodiments, the photoresist includes bulk photoresist encapsulated by a crust, which is denser than the bulk photoresist. The photoresist may be an ion-implanted photoresist. In some embodiments, the exposure to the hydroxyl-generating gases chemically and/or physically modifies one or more of the bulk photoresist and the crust.

Another aspect of the disclosure involves an apparatus for processing semiconductor substrates including a process chamber, which includes a showerhead and a substrate support; and a controller having at least one processor and a memory, such that the at least one processor and the memory are communicatively connected with one another, the at least one processor is at least operatively connected with the flow-control hardware, and the memory stores machine-readable instructions for: introducing one or more hydroxyl-generating gases under conditions that prevent or suppress condensation of the one or more hydroxyl-generating gases to thereby treat the photoresist prior to introducing a plasma to remove the photoresist.

Another aspect of the disclosure involves an apparatus for processing semiconductor substrates including a process chamber, which includes a showerhead and a substrate support; and a controller having at least one processor and a memory, such that the at least one processor and the memory are communicatively connected with one another, the at least one processor is at least operatively connected with the flow-control hardware, and the memory stores machine-readable instructions for: introducing hydrogen peroxide vapor to modify an organic film on a substrate prior to introducing a plasma to remove the organic film.

These and other aspects are described further below with reference to the drawings.

BRIEF DESCRIPTION OF THE DRAWINGS

FIGS. 8A, 8B, and 8C are graphs showing experimental results from performing disclosed embodiments.

DETAILED DESCRIPTION

Figure 1A:
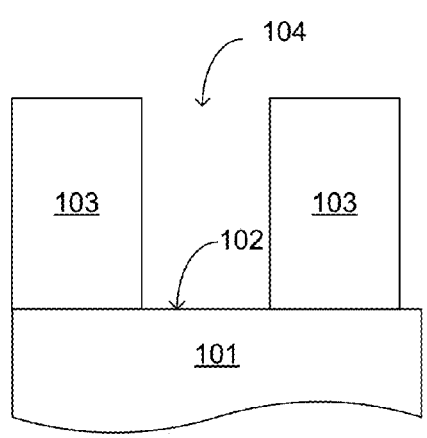
FIGS. 1A-1D are schematic illustrations of various stages of semiconductor device fabrication before and after ion implantation and stripping operations.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In this application, the terms "work piece," "semiconductor wafer," "wafer," and "partially fabricated integrated circuit" will be used interchangeably. One skilled in the art would understand that the term "partially fabricated integrated circuit" can refer to a silicon wafer during any of many stages of integrated circuit fabrication thereon. The following detailed description assumes the disclosed embodiments are implemented on a wafer. However, the disclosed embodiments are not so limited. The work piece may be of various shapes, sizes, and materials. In addition to semiconductor wafers, other work pieces that may take advantage of the disclosed embodiments include various articles such as displays, printed circuit boards, and the like. Although the disclosed embodiments primarily discuss photoresist, the disclosed embodiments may be applicable to other organic films or films including organic compounds. Examples include implanted SiARC and polymeric residue or film on an organic material (e.g., spin-on carbon (SOC)).

Photoresist is a light-sensitive material used in certain fabrication processes. Lithographic patterning of a film may include some or all of the following steps, each step provided with a number of possible tools: (1) application of photoresist on a substrate using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or substrate by using a dry or plasma-assisted etching tool; and (6) removing the resist using a tool such as an radio frequency (RF) or microwave plasma resist stripper.

The photoresist may form a patterned coating on a work piece, e.g., a semiconductor wafer, during processing. Semiconductor processes such as etching, depositing, and ion implanting may be performed on the uncovered surface and the remaining photoresist prior to removing the resist. After performing one or more semiconductor processes, the remaining photoresist is removed in a strip operation.

During ion implantation, dopant ions, e.g., ions of boron, boron difluoride, indium, gallium, thallium, phosphorous, arsenic, antimony, bismuth, or germanium, are accelerated toward a work piece target. For example the ions implant in exposed regions of the work piece to form well regions (source/drain) as well as lightly doped drain (LDD) and doubled diffused drain (DDD) regions. During high-dose ion-implantation (HDI) and plasma doping processes, the ion implant process may also impregnate the resist with the implant species, deplete the surface of hydrogen, and create an upper crust layer that has properties different from the underlying bulk photoresist. The crust of the resist may be a carbonized layer that is much denser and more diamond-like than the underlying bulk layer. The crust may also have a higher concentration of unsaturated bonds than in the bulk photoresist. These two layers have different thermal expansion rates and react to stripping processes at different rates. In HDI, the ion dose may be greater than $1 \times 10^{15}$ ions/cm$^2$ and the energy may be from 1 keV to greater than 100 keV. Such high doses can create post HDI resists with pronounced differences between the crust layer and bulk layer. The properties of the crust make it challenging for it to be removed completely without leaving behind residue on the wafer surface.

FIGS. 1A-1D depict various stages of an example of semiconductor fabrication before and after ion implantation and stripping operations. FIG. 1A shows a semiconductor substrate 101 including an exposed silicon surface 102 coated with a bulk photoresist material 103. While substrate 101 in the example of FIG. 1A has an exposed silicon surface 102, according to various embodiments, the substrate 101 may include one or more layers of deposited film, e.g., oxide film, silicide contact, and/or polysilicon film, or may be a bare silicon substrate, including, for example, a silicon-on-insulator type substrate. The deposited film may also include, for example, silicon nitride, silicon oxide, materials found in a high-k/metal gate stack, titanium nitride, tantalum nitride, and metals. Any of these materials may be exposed by the bulk photoresist 103. Initially, the photoresist material coats the entire substrate surface. The photoresist is then exposed to patterned radiation generated through a mask and developed to remove a portion of the material, e.g., the opening 104 shown in FIG. 1A between the remaining bulk photoresist material 103.

Figure 1B:
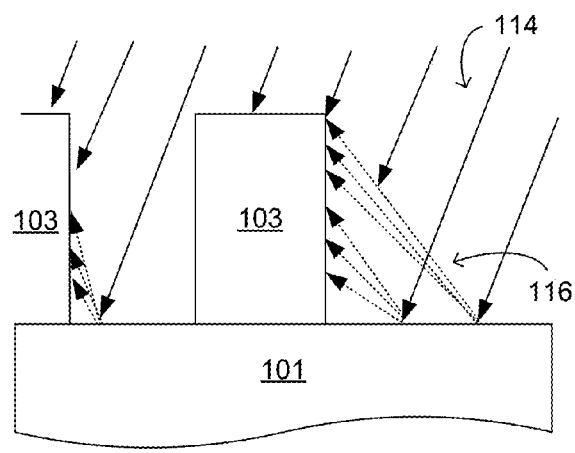

After the photoresist is patterned, the substrate is then exposed to an ion implant process. During ion implantation, the surface of the work piece or wafer is implanted with dopant ions. The process may be, for example, a plasma-immersion ion implantation (PIII) process, a plasma doping process, or a beam-line process. FIG. 1B depicts the substrate during implantation, including ion beam flux 114 and back-sputter flux 116. The back-sputter flux 116 deposits substrate materials (such as arsenic, Si, SiO$_2$, or SiN) on the sidewall of the photoresist 103. The ions from the ion beam flux 114 bombard the substrate surface 102, including the exposed silicon layer 102 and the photoresist 103. At the exposed silicon layer 102, a doped region 109 is created. The ion energy or intensity of the bombardment determines the depth or thickness of the doped region. The density of the ion flux determines the extent of doping.

Figure 1C:
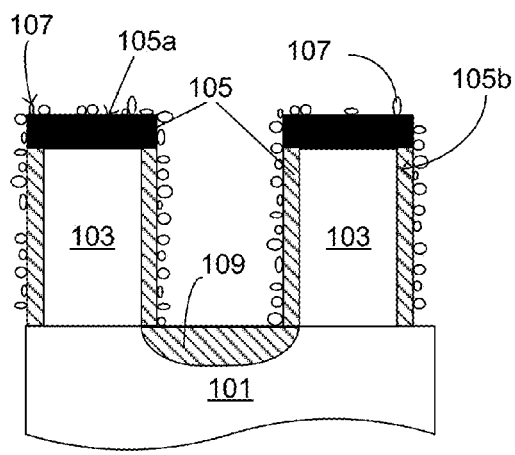

FIG. 1C shows the wafer with small amounts of the underlying material 107 sputtered onto the photoresist sidewalls due to high energy ion implantation. This material may include some of the implant species, other material in the plasma or ion beam, and byproducts of the implantation. Materials include arsenic, silicon, aluminum, carbon, fluorine, titanium, other contact materials such as cobalt, and oxygen in both elemental and compound forms. The actual species depend on the composition of the substrate before ion implant, the photoresist, and the implanted species. The ions impregnate the photoresist surface and contribute to creating a crust layer 105 on the top (105a) and sidewalls (105b) of the bulk photoresist 103 as shown in FIG. 1C. The crust 105 may also be depleted of hydrogen. The top crust 105a and side crust 105b may be exposed to different chemistries during implantation due to the angle of the ion implant beam flux 114 as well as the sidewall deposition from the back-sputtered flux 116 and thus the top crust 105a and side crust 105b may have different chemistries.

The crust 105 may be carbonized and include highly cross-linked polymer chains and organic compounds. In many embodiments, the crust layer 105 is denser than the bulk photoresist 103. The relative density depends on the ion flux while the thickness of the crust layer 105 depends on the ion energy. The density difference between the crust and underlying bulk photoresist layer after HDI may be even higher and the crust may also be thicker. This crust layer 105 is harder to strip than the bulk photoresist 103 below. Removal rates of the crust layer may be 50% or 75% slower than the underlying bulk photoresist 103. The bulk photoresist 103 may contain relatively high levels of chemically bonded nitrogen and some of its original casting solvent.

At elevated wafer temperatures, e.g., above 150° C. to above 200° C., the bulk photoresist 103 may outgas and expand relative to the crust layer 105. The entire photoresist may then "pop" as the underlying bulk photoresist 103 builds up pressure under the crust layer 105. Photoresist popping is a source of particles and process defects because the residues are especially hard to clean from the wafer surface and chamber internal parts. Thus, the crusted photoresist is often stripped at low temperatures in order to avoid popping. The low-temperature processing, however, reduces the reactivity of the plasma species with the crust layer 105, resulting in a slower photoresist-strip process and lower throughput.

Figure 1D:
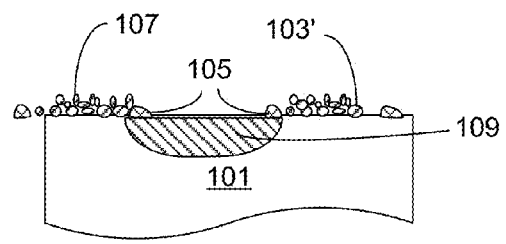

FIG. 1D shows the substrate 101 after a strip that fails to completely remove the photoresist 103' including the crust layer 105, and the sidewall sputter residue 107. The sidewall sputter residue 107 may include particles that do not form a volatile compound under conventional strip chemistries. These particles may remain after a conventional strip operation. The residue 107 may also include oxides of implanted species formed with the reactive oxygen used in the conventional strip chemistry, such as boron oxide and arsenic oxide. Portions of the crust layer 105 may also remain on the substrate 101. The crust at the sidewalls and corners at the bottom of photoresist vias may be hard to strip because of geometries.

Conventional HDI strip (HDIS) processes employ oxygen chemistries where monatomic oxygen plasma is formed away from the process chamber and then directed at the work piece surface. The reactive oxygen combines with the photoresist to form gaseous byproducts, which are removed with a vacuum pump. For HDIS, additional gases may be used to remove the implanted dopants with oxygen. Primary HDIS considerations may include strip rate, amount of residue, and film loss of the exposed and underlying film layer.

After stripping, the surface should be residue-free or substantially residue-free to ensure high yield and eliminate additional residue removal processing. However, as shown in FIG. 1D, residues are commonly found on the substrate surface after conventional HDIS due to incomplete removal of crust, sputtering during the high-energy implant, and/or oxidation of implant atoms in the resist. For a resist with a thicker crust, the difference between the crust layer and bulk resist layer is even more pronounced. The thicker crust at sidewalls and corners are even harder to strip. Thus, strip processes designed to remove thick crust also tend to remove more of the silicon-containing substrate.

Conventionally, residues may be removed by over-stripping to address resist uniformity and geometries in addition to residue removal by stripping past the point nominally used to remove all photoresist. If the photoresist is totally removed in some areas of the wafer but not others, continuation of the strip process would cause additional material, typically silicon and silicon oxide, to be removed from areas that are already stripped. Thus, over-stripping sometimes removes some of the underlying functional device structure, thereby incurring high material loss. Material loss is a function of resist thickness, crust thickness, and percent over-strip. Longer and more aggressive stripping to remove a thicker resist can also remove more silicon. Alternatively, fluorine-containing plasmas are often used to alleviate residue generation. However, the use of fluorine may lead to substantial material loss, which is generally undesirable for the advanced technology nodes.

In advanced technology nodes (e.g., 45 nm and beyond), however, over-strip processes may not be used because in some applications, such as logic devices, any material loss may render the device ineffective. Therefore, it is very challenging to strip an implanted photoresist completely without leaving behind residue while preserving the integrity of the surrounding materials. At the device layer, even very little silicon loss from the transistor source/drain regions may adversely affect device performance and yield, especially for ultra-shallow junction devices fabricated at advanced technology nodes. Moreover, many conventional stripping techniques may cause the crust to peel or flake, leaving particles of crust on other parts of the substrate surface, which is difficult, if not impossible, to remove. Using a less aggressive, mild non-fluorine plasma to remove the photoresist in conventional methods leaves residue on the wafer surface. The methods provided herein can remove implanted photoresist completely, leaving no residue, without incurring loss to the surrounding materials.

In one aspect, the methods involve treating a photoresist prior to removal by exposing it to hydroxyl-generating gas. Hydroxyl-generating gases are gases or mixtures of gases that can react or decompose to liberate hydroxyl groups (—OH). Generally, though not necessarily, a hydroxyl-generating gas contains at least one hydroxyl group. The reactive species during the treatment may be an ionic species, or other high energy molecular species. In many embodiments, the hydroxyl radical is the reactive species.

The treatment allows a subsequent photoresist removal operation to use a milder strip chemistry such that the strip leads to an ultralow material loss while still generating a residue-free surface. For example, a substrate may be exposed to hydrogen peroxide ($H_2O_2$) vapor prior to using a mild non-fluorine plasma removal. The treatment methods described herein may result in substantially residue-free substrates and little or no material loss subsequent to photoresist removal. In many embodiments, the treatment is performed under non-plasma conditions. The disclosed embodiments are suitable for wafers having very small features or critical dimensions, e.g., at or less than 100 nm, at or less than 65 nm, or at or less than 45 nm. The disclosed embodiments may be particularly suitable for very shallow junctions of advanced logic devices as well as wafers undergoing front end of the line (FEOL) ion implantation, especially high-dose ion implantation.

In some embodiments, a hydroxyl-generating vapor compound treatment may modify both the crust and underlying bulk photoresist. In some cases, water ($H_2O$) vapor may be added to the hydroxyl-generating compound in order to enhance the modifications, while in others, the hydroxyl-generating vapor compound may be used by itself. Without being bound by a particular theory, the presence of water may help with increasing the concentration of the hydroxyl group. In various embodiments, water vapor is added to hydrogen peroxide. For example, the implanted photoresist may be exposed to $H_2O_2/H_2O$ vapor, which may result in chemical and/or physical modification to enhance the subsequent stripping of the implanted photoresist, ultimately resulting in markedly improved residue removal. In some embodiments, hydrogen peroxide vapor is used by itself.

The described methods and apparatus may be effectively used to treat photoresists after a medium or low dose implant in addition to after a high dose implant. Although specific dopant ions such as boron, arsenic, and phosphorous are discussed, the described methods and apparatus may be effectively used to treat resists impregnated with other dopants, such as nitrogen, oxygen, carbon, germanium, and aluminum. Further, the described methods and apparatus may also find utility in removing undoped resists.

Other treatment processes may be used to modify implanted photoresist, such as an ozone/water ($DIO_3$) process. In conventional $DIO_3$ processes, however, the water vapor is condensed into liquid phase on the wafer surface before a series of chemical reactions occur with the ozone, ultimately generating the active species that help remove the photoresist. The condensation of water on the wafer surface may not be preferable for various reasons. Because the photoresist surface is hydrophobic, dewetting of the water on the wafer surface has a tendency to lead to non-uniform removal of the photoresist. The thickness of the liquid water film on the wafer surface may be controlled to increase the rate of reaction between the active species and the photoresist surface but such control may use complex hardware, which increases the cost of performing the strip. In contrast, various embodiments disclosed herein may negate a gas-to-liquid phase change, which significantly minimizes the complexity of the hardware and process operations used to implement the treatment process. Unlike the conventional $DIO_3$ process, the disclosed embodiments may be such that the hydroxyl-generating compounds may exist in gas phase during the treatment process. As a result, the removal uniformity as a result of performing the disclosed embodiments may be improved.

Figure 2:
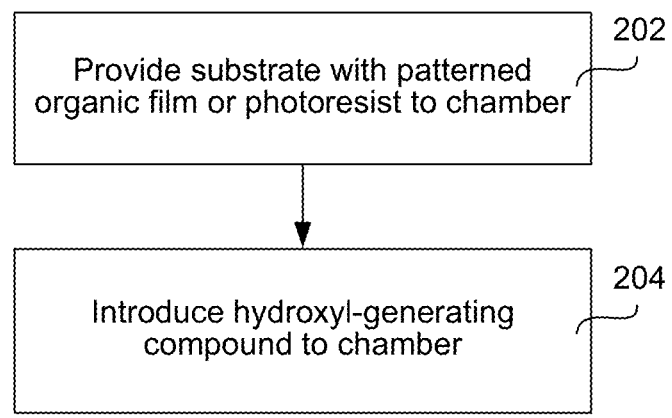
FIG. 2 is a process flow diagram showing relevant operations of methods in accordance with various embodiments.

FIG. 2 is a process flow diagram depicting various operations for performing methods in accordance with the disclosed embodiments. In operation 202, a substrate with a patterned photoresist is provided in a processing chamber. In many embodiments, the substrate is a semiconductor substrate, such as a silicon substrate. In various embodiments, the substrate includes exposed layers of etched material. Examples of these materials include silicon nitride, silicon, silicon oxide, materials in a high-k/metal gate stack, titanium nitride, tantalum nitride, and metals.

In various embodiments, the substrate with the patterned photoresist has undergone one or more semiconductor processes, such as etching, deposition, and ion-implantation. The patterned photoresist may include both a crust and a bulk photoresist. In many embodiments, a crust is formed at the top surface and, optionally, the sidewalls of the photoresist. In various embodiments, the crust at the top and the sidewalls are non-uniform in chemistry and/or thickness. The thickness and chemistry of the crust may depend on the operations performed on the substrate prior to operation 202. In various embodiments, the crust is between about 200 Å and about 1500 Å thick, or between about 200 Å and about 600 Å. In various embodiments, the bulk photoresist is between about 60 nm and about 1000 nm thick. The disclosed embodiments may be performed on a photoresist of any thickness including photoresists with a crust of any thickness.

Next, in operation 204, one or more hydroxyl-generating compounds are introduced to the chamber such that the substrate is exposed to the hydroxyl-generating compound (s). In some embodiments, one or more hydroxyl-containing compounds are introduced to the chamber in operation 204. In various embodiments, the hydroxyl-generating compound is hydrogen peroxide ($H_2O_2$). In many embodiments, the hydroxyl-generating compound is in gas phase (also referred as vapor phase). In general, gas phase compounds are not in a plasma. In some embodiments, they may be activated by an energy source such as ultra-violet or microwave radiation. Examples of hydroxyl-generating compounds may include a peroxide, water, ozone, alcohol-containing compounds such as ethanol and isopropanol, and any combinations thereof. In some embodiments, one or more hydroxyl-generating compounds includes a mixture of peroxide and water.

The one or more hydroxyl-generating compounds may be premixed, partially mixed, or unmixed. Individual gas or vapor sources may flow into a mixing plenum before being introduced to the chamber. In other embodiments, one or more hydroxyl-generating compounds may separately enter the chamber.

In some embodiments, the hydroxyl-generating compound is introduced under non-plasma conditions. In various embodiments, the hydroxyl groups are generated using a peroxide generator. In some embodiments, however, the hydroxyl-generating compound may be optionally activated prior to or during exposure to the substrate. Activation may increase the concentration of hydroxyl groups or hydroxyl radicals. The hydroxyl-generating compound or compounds may be activated from an activation energy source. For example, the hydroxyl-generating compound may be activated remotely upstream from its introduction into the chamber, or it may be activated in the processing chamber. In various embodiments, the activation is performed with ultra-violet radiation. In some embodiments, the activation is performed using a controller heat diffuser. In some embodiments, the hydroxyl-generating compound is activated using photolysis of water vapor or by thermal generation.

While the hydroxyl-generating compound is in a non-plasma state in many embodiments, in some embodiments, the activation may be performed using radio frequency (RF) plasma. For example, a plasma may be used to generate hydrogen and $NO_2$, which may then react with each other to form OH. The reaction may be represented by the following generic chemical reaction:

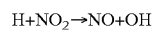

In some embodiments, hydroxyl radicals generated from a plasma may be introduced to the processing chamber with hydroxyl radicals activated or generated from another source. Note however, that although plasma-activated compounds may be used to generate hydroxyl radicals, plasma-activated compounds may be damaging to the substrate and may cause oxidation of the substrate, so care should be taken to avoid such damage.

In some embodiments, plasma for the photoresist removal after the treatment with OH groups is generated from a forming gas (mixture of 4% $H_2$ in $N_2$). Small concentrations of oxygen-radical-producing gases, such as $O_2$ or $CO_2$ may be used. An oxygen radical may be added in small concentrations to increase the removal rate of the photoresist. Note that care should be taken to ensure that oxygen radical concentration is not too high so as to cause material loss.

During operation 204, the substrate temperature should be at a level to minimize condensation and sufficiently low enough to prevent damage to the substrate. The temperature may be adjusted depending on the pressure of the hydroxyl-generating compound and the volume of the treatment chamber. Examples of substrate temperatures may be between about 20° C. and about 250° C., or between about 20° C. and about 150° C.

The substrate may be exposed to the hydroxyl-generating compound for a time sufficient to treat the photoresist. Exposure time may depend on factors such as the amount and thickness of the photoresist, the treatment chemistry, the temperature, and the concentration of the hydroxyl-generating compound. For example, in various embodiments, the substrate is exposed to the hydroxyl-generating compound in the chamber for a time between about 10 seconds and about 10 minutes.

The hydroxyl-generating compound may be introduced in gas phase. Without being bound by a particular theory, it is believed that introducing the hydroxyl-generating compound in gas phase may be beneficial to avoid issues associated with condensation, e.g., non-uniformity on the substrate and transport limitations of reactive species across a liquid film. If a liquid hydroxyl-generating compound is used, both pressure and temperature may be adjusted such that the process operates substantially in a liquid state. In some embodiments, there may be a small amount of condensation on the surface, which may be useful in treating the photoresist. In some embodiments where the substrate is exposed to conditions that prevent condensation of one or more hydroxyl-generating gases, some small amount of condensation is present on the surface of the substrate. In other embodiments, no condensation is present.

The concentration of the hydroxyl-generating compound may be an amount sufficient to treat the photoresist without condensation and without damaging the substrate. The concentration may depend on the treatment chemistry, the size of the substrate, the amount and thickness of the photoresist, the temperature, and the volume of the treatment chamber. The concentration may be represented for example in parts per million (ppm) or partial pressure. Example concentrations of hydroxyl-generating compound introduced to the chamber may be between about 225 ppm and about 10000 ppm, or between about 550 ppm and about 10000 ppm, or between about 550 ppm and about 5000 ppm. The partial pressure of a hydroxyl-generating compound introduced to the chamber will vary depending on the total pressure of the chamber. In some embodiments, the partial pressure may be limited by the apparatus and adjusted accordingly using the above described concentrations of the hydroxyl-generating compound. The above describe concentrations may be applicable to a wide range of total chamber pressures.

In some embodiments, the total pressure of the chamber may be between about 0.6 Torr and about 760 Torr, or between about 0.6 Torr and about 3.5 Torr, or between about 10 Torr and 760 Torr. In some embodiments where the treatment is performed in the same chamber as the subsequent photoresist strip, the pressure of the chamber may be between about 0.6 Torr and about 10 Torr. In some embodiments, the total pressure of the chamber is about 760 Torr.

In one example, for a total chamber pressure of 1 atm, the partial pressure of hydrogen peroxide vapor may be between about 0.4 Torr and about 7.6 Torr. In another example, the partial pressure of water vapor may be about 0.2 Torr in a chamber with a total pressure of 760 Torr.

The hydroxyl-generating compound can be introduced to the chamber using a carrier gas. Example carrier gases include nitrogen ($N_2$) and any other suitable carrier gas. In some embodiments, the hydroxyl-generating compound is flowed continuously. In some embodiments, if two or more hydroxyl-generating compounds are introduced to the chamber, the two or more hydroxyl-generating compounds may be flowed together or pulsed alternately. For example, in some embodiments, peroxide and water may be pulsed alternately to the chamber.

The treatment process described herein may have multiple advantages in photoresist strip processes. One primary benefit of the treatment process described herein is the decreased material loss. The treatment itself may not substantially cause material loss to the surrounding materials, and since a milder plasma may be used, there may be reduced or no material loss during subsequent removal as well.

The conditions of the treatment described above with respect to operation 204 may be such so as not to condense on the surface of the substrate during treatment. The conditions may be such so as not to oxidize surrounding materials during the treatment process. In some embodiments, the treatment conditions are such that condensation of the one or more hydroxyl-generating gases on the surface of the substrate is prevented or suppressed. For example, the treatment may be performed at a pressure sufficient to provide enough hydroxyl-generating gas to treat the substrate, but prevent condensation of gases on the surface. Likewise, the treatment may be performed at a temperature and pressure such that the one or more hydroxyl-generating gases remain in gas phase throughout treatment to prevent condensation on the surface of the substrate. In some embodiments, there may be a small amount of condensation on the surface of the substrate. Other conditions that may be considered include temperature of the chamber and substrate, chemistry of the one or more hydroxyl-generating gases, and presence of other chemistries during treatment.

The conditions to prevent condensation may be determined by analyzing the phase diagram associated with the one or more hydroxyl-generating gases and choosing a temperature and pressure at which condensation is prevented. The temperature and pressure may also be determined by evaluating the mass-mass percent concentration for aqueous mixtures of one or more hydroxyl-generating compounds. For example, if the treatment includes flowing hydrogen peroxide and water, the partial pressure or vapor pressure and temperature may depend on the mass-mass percent concentration of aqueous hydrogen peroxide solutions suitable to prevent condensation into liquid phase and maintain presence in gas phase. Equilibrium curves and phase diagrams for mixtures of hydrogen peroxide and water which may be used to determine treatment conditions may be found in Craig W. Jones, *Applications of Hydrogen Peroxide and Derivatives* ch. 1 (1999).

Without being bound by any particular theory, it is believed that the treatment process modifies at least one of or both the crust photoresist and the bulk photoresist, for example, that the treatment chemically and/or physically modifies either the crust or the bulk photoresist, or both. For example, the hydroxyl groups generated from one or more hydroxyl-generating compounds may chemically react with the organic functional groups present in the photoresist (e.g., alkenes, alkanes, phenols), resulting in a series of chemical reactions. These chemical reactions may ultimately lead to the decomposition or fragmentation of the polymer chains, which allows the crust layer to be removed more easily during the subsequent plasma exposure. It is also plausible that voids or defects may be created during the entire process of chemical and physical modifications of the crust, which may in turn facilitate the transport of the hydroxyl groups to the underlying bulk photoresist. The hydroxyl radicals may also then modify the bulk photoresist by allowing a similar series of chemical and physical events as described above to occur in the bulk photoresist. Collectively, the exposure of the implanted photoresist to the hydroxyl groups may allow the implanted photoresist to be subsequently stripped using a mild process to generate a residue-free surface. For example, instead of using aggressive fluorine-containing plasmas to strip implanted photoresist, the treatment step may allow the sample to be stripped using a mild nonfluorine-containing plasma and still be residue free. The combination of the treatment and the subsequent non-fluorine-containing plasma may significantly prevent material loss. The treatment may also enhance the reactivity of the subsequent plasma chemistry in ultimately removing the implanted photoresist.

The modifications to the implanted photoresist that may have resulted from the treatment exposure may also potentially increase the rate of photoresist strip resulting in an increase in throughput. For example, physical modifications in the crust, such as the creation of voids or channels and the fragmentation of the polymer chains, may increase the removal rate of both the crust and the underlying bulk photoresist during the subsequent strip process. As a result, the overall throughput of the removal of the implanted photoresist increases.

To further conserve material loss, the treatment step may be performed in the absence of plasma and at relatively low temperatures, such as at temperatures less than about 200° C. These conditions are conducive to suppressing the oxidation of the exposed surrounding materials, thereby satisfying the ultralow oxidation and loss requirements for semiconductor processing in the advanced nodes.

Thus, the treatment methods described herein may yield improved, no- or low-residue photoresist removal at low temperatures using a mild plasma, which may improve substrate throughput. The treatment methods may be applicable to removal of photoresists that undergo high dose ion implant including beam-line, plasma doping, among others. Various examples of photoresist removal processes are provided herein, but the treatment methods in the disclosed embodiments may be applicable to treatment of any type of photoresist prior to removal by any photoresist method.

Optionally, a photoresist removal process may be performed after the treatment in operation 204. A mild non-fluorine plasma, or a fluorine-containing plasma may be used to remove the photoresist after operation 204. In various embodiments, a hydrogen/nitrogen ($H_2/N_2$) plasma may be introduced to the chamber to remove the photoresist. Another example photoresist removal method may involve exposing the treated photoresist to plasmas that are produced from gases that contain hydrogen. In some embodiments, a fluorine-containing plasma may be used having a low concentration of fluorine. In some embodiments, the gases may also contain a weak oxidizing agent and a fluorine-containing gas. In some embodiments, the gases may also contain a weak oxidizing agent and a non-fluorine-containing gas.

Examples of weak oxidizing agents include carbon oxides, such as carbon dioxide ($CO_2$), carbon monoxide (CO); nitrogen oxides, such as nitrous oxide ($N_2O$), nitric oxide (NO), nitrogen dioxide ($NO_2$); and sulfur oxides, such as sulfur oxide (SO) and sulfur dioxide ($SO_2$). Examples of other weak oxides include any oxygen-containing hydrocarbons ($C_xH_yO_z$) and water ($H_2O$). In certain embodiments, the weak oxidizing agent is a carbon-containing compound. In particular embodiments, carbon dioxide is used as the weak oxidizing agent because it is cheap, safe, and effective.

The fluorine-containing gas can be nitrogen trifluoride ($NF_3$), sulfur hexafluoride ($SF_6$), hexafluoroethane ($C_2F_6$), tetrafluoromethane ($CF_4$), trifluoromethane ($CHF_3$), difluoromethane ($CH_2F_2$), octafluoropropane ($C_3F_8$), octafluorocyclobutane ($C_4F_8$), octafluoro[1-]butene ($C_4F_8$), octafluoro[2-]butene ($C_4F_8$), octafluoroisobutylene ($C_4F_8$), fluorine ($F_2$), and the like. In some embodiments, the fluorine-containing gas is $NF_3$, $SF_6$, $F_2$, or hydrogen fluoride (HF) vapor. In some embodiments, the fluorine-containing compound is a non-carbon-containing compound. In some embodiments, $NF_3$ is used as the fluorine-containing gas. In some embodiments, any fluorine-containing gas that readily converts to HF vapor may be used. In some embodiments, an oxygen-based chemistry or other suitable strip chemistry may be used to remove the photoresist.

One skilled in the art will recognize that the actual species present in the plasma may be a mixture of different ions, radicals, and molecules derived from the hydrogen, weak oxidizing agent, and processing gas. It is noted that other species may be present in the reaction chamber during the optional strip process, such as small hydrocarbons, carbon dioxide, water vapor and other volatile components as the plasma reacts with and breaks down the organic photoresist and other residues. One skilled in the art will also recognize that the initial gas/gases introduced into the plasma is/are often different from the gas/gases that exist in the plasma as well as the gas/gases that contact the work piece surface during strip.

Various types of plasma sources may be used for the optional photoresist strip, including RF, DC, and microwave based plasma sources. In some embodiments, a downstream RF plasma source is used. Typically, the RF plasma power for a 300 mm wafer ranges between about 300 Watts to about 10 Kilowatts. In some embodiments, the RF plasma power is between about 2000 Watts and 5000 Watts, e.g., 3500 W.

Apparatus

Figure 3:
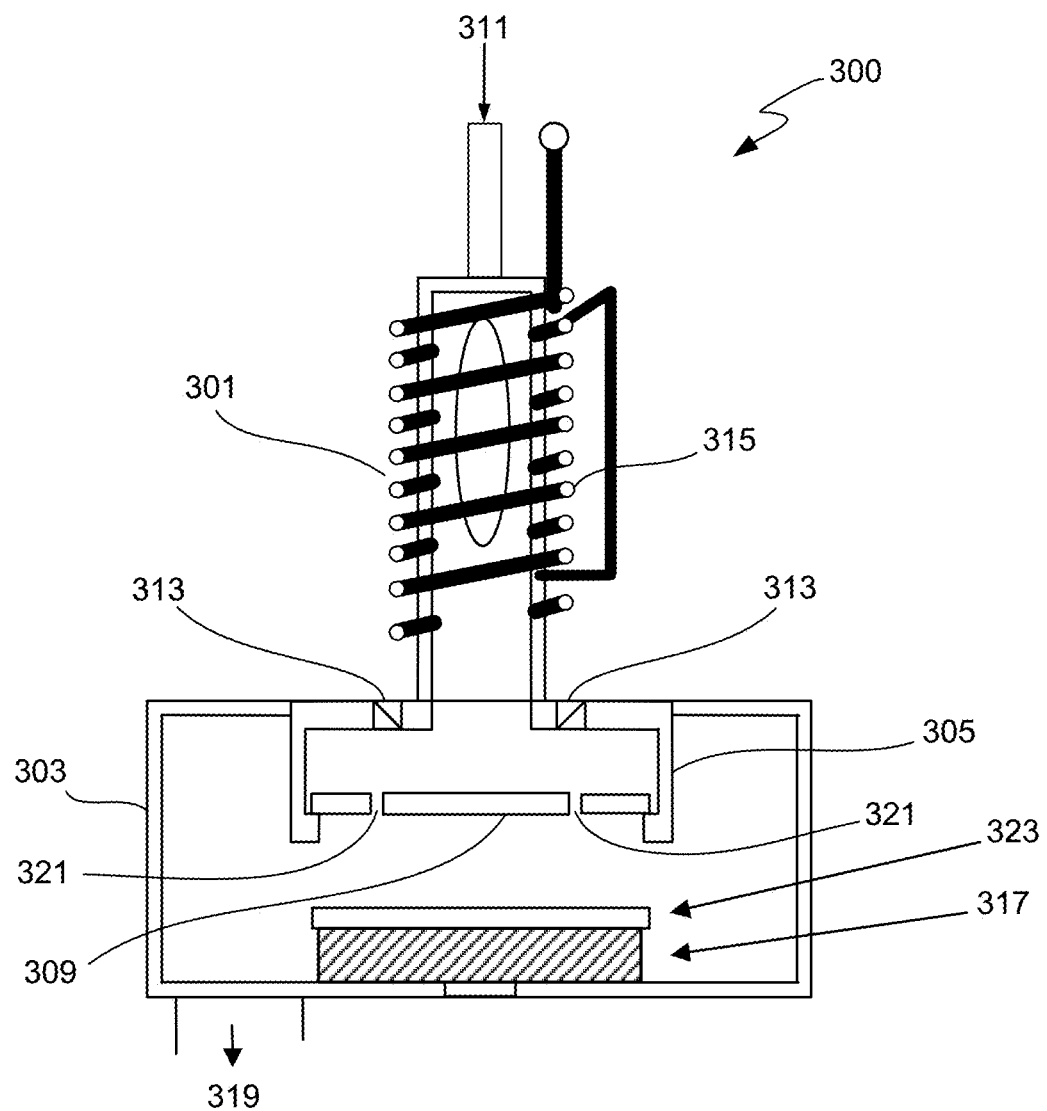
FIG. 3 is a schematic illustration of an example of a process chamber suitable for practicing disclosed embodiments.

FIG. 3 is a schematic illustration of an example of an apparatus 300 according to certain embodiments. Apparatus 300 has an optional plasma source 301 and a process chamber 303 separated by a showerhead assembly 305. Plasma source 301 is connected to gas inlet 311. Showerhead 309 forms the bottom of showerhead assembly 305. Inert gas inlets 313 may be downstream of plasma source 301 and upstream of wafer 323 and showerhead 309. Inside process chamber 303, a wafer 323 with photoresist/dry etch byproduct material or an organic film rests on a substrate support (or stage) 317. Substrate support 317 may be fitted with a temperature control mechanism that may heat or cool a wafer 323 on the platen as necessary. In some embodiments, platen 317 is also configured for applying a bias to wafer 323. Low pressure is attained in reaction chamber 303 via vacuum pump and conduit 319.

In operation, a gas is introduced via gas inlet 311 to the plasma source 301. The gas introduced to the plasma source contains the chemically active species that will be ionized in the plasma source to form a plasma. Gas inlet 311 may be any type of gas inlet and may include multiple ports or jets. Plasma source 301 is where the active species of the gas introduced to the source are generated to form a plasma. In FIG. 3, an RF plasma source is shown with induction coils 315, which are energized to form the plasma. An inert gas is introduced via gas inlets 313 upstream of the showerhead and downstream of the plasma source. The inert gas mixes with the plasma. Gas inlets 313 may be any type of gas inlets and may include multiple ports or jets to optimize mixing the inert gas with the plasma. Showerhead 309 directs the plasma/inert gas mixture into process chamber 303 through showerhead holes 321. There may be any number and arrangement of showerhead holes 321 to maximize uniformity of the plasma/gas mixture in process chamber 303. Showerhead assembly 305, which may be electrically grounded or have an applied voltage, may capture and discharge some ions and thereby change the composition of the gas flowing into process chamber 303: i.e., the gas will contain an increased proportion of neutral species. As mentioned, wafer 323 may be temperature controlled and/or a RF bias may be applied. The plasma/inert gas mixture removes the photoresist/etch byproduct material from the wafer.

In some embodiments, the apparatus does not include showerhead assembly 305 and showerhead 309. In these embodiments, the inert gas inlets 313 introduce the compound directly into the process chamber where it optionally mixes with the plasma upstream of wafer 323. In many embodiments, the apparatus does not include plasma source 301 and the compound is directly introduced to the chamber though gas inlet 311 or 313. In embodiments where a plasma is used, various configurations and geometries of the plasma source 301 and induction coils 315 may be used. For example, induction coils 315 may loop around the plasma source 301 in an interlaced pattern. In another example, the plasma source 301 may be shaped as a dome instead of a cylinder.

The process chamber may be any suitable reaction chamber that can also be used for the subsequent optional strip operation being performed, such as the one depicted in FIG. 3. In many embodiments, the process chamber may be one station of a multi-station apparatus or it may simply be a single chamber apparatus. The treatment methods described herein may also be performed in a loadlock, or a chamber designed specifically for treatment prior to photoresist stripping. The chamber may also include multiple stations where different wafers are processed simultaneously. The process chamber may be the same chamber where the implant, etch, or other resist-mediated process takes place. In other embodiments, a separate chamber is reserved for the strip. In some embodiments, the treatment is performed in the same chamber where prior etching, depositing, or ion-implanting processes were performed. In some embodiments, the treatment is performed in a chamber separate from where prior etch, deposition, or ion-implantation processes were performed.

A single-station strip apparatus may be used to perform the disclosed embodiments. In some embodiments, the single-station strip apparatus may include one or more chambers, and the treatment may be performed at one chamber prior to photoresist removal. In some embodiments, the treatment is performed in the same chamber as a strip. In some embodiments, the strip is performed in a chamber different from the chamber where the treatment is performed.

Two or more stations may be used to perform treatment and/or strip in a parallel processing. Alternatively a wafer may be indexed to have the treatment operations performed over two or more stations sequentially. Suitable plasma apparatuses include the Gamma 2100, 2130 I$^2$CP (Interlaced Inductively Coupled Plasma), G400, and GxT offered by Lam Research Corp. of Fremont, Calif.

The process chamber may include one or more processing stations on which strip operations are performed. In certain embodiments, the one or more processing stations includes a preheat station, at least one strip station, and an over-ash station. The substrate support is configured to support the wafer during processing. The substrate support may also transfer heat to and from the wafer during processing to adjust the wafer temperature as necessary. In certain embodiments, the wafer is supported on a plurality of minimum contacts and does not physically contact the wafer support surface plane. A spindle picks up the wafer and transfers the wafer from one station to another.

The hydroxyl-generating compound may be produced and/or activated upstream of the chamber. For example, peroxide and water vapor may be activated ex situ to generate OH groups, which are subsequently delivered to the process chamber. The hydroxyl-generating compound delivery system may be integrated into a controller for the process chamber, which is programmed to control process conditions during operation. The controller may include one or more memory devices and one or more processors. A processor may include a CPU or computer, analog, and/or digital input/output connections, stepper motor controller boards, etc.

The hydroxyl-generating compound may be activated within the chamber using a plasma. For example, hydrogen and NO$_2$ may be introduced to the chamber with a plasma to generate OH radicals in situ.

Figure 4:
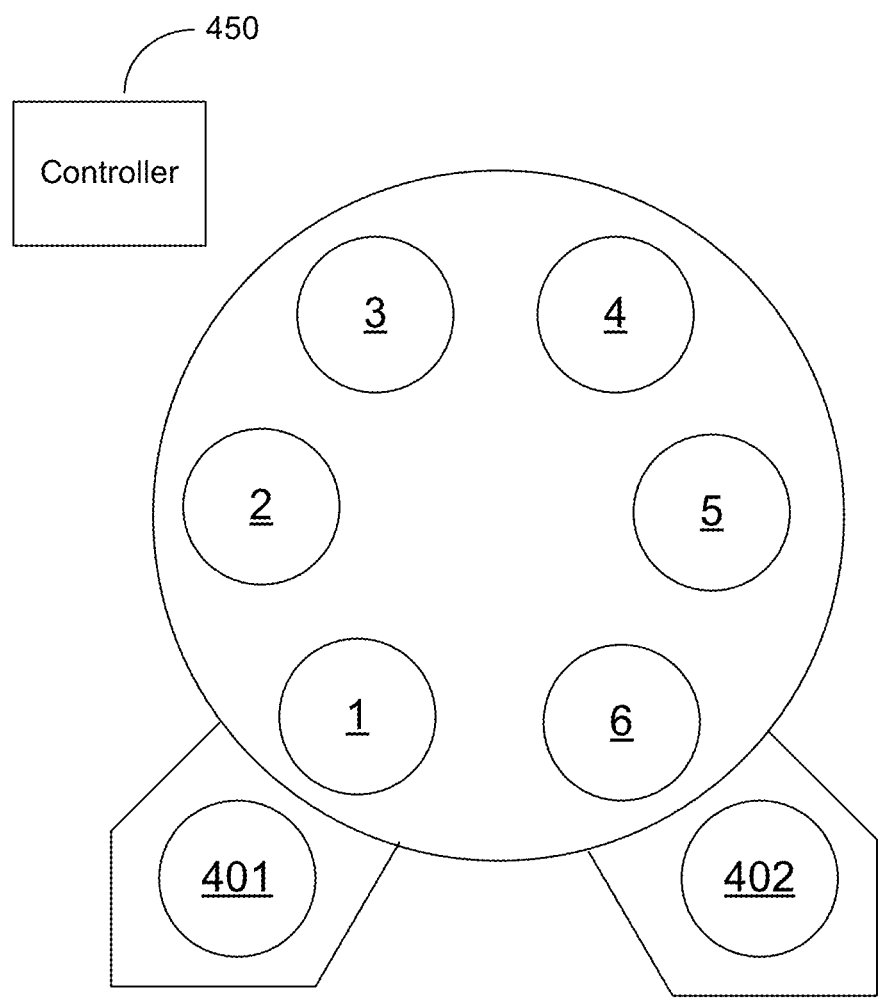
FIG. 4 is a schematic illustration of an example of a tool suitable for practicing disclosed embodiments.

A multi-station strip apparatus may be employed to perform the photoresist or organic film and residue stripping processes described herein. FIG. 4 is a simplified schematic illustration showing a top view of such an apparatus including stations 1, 2, 3, 4, 5, and 6. In some embodiments, the treatment is performed in a loadlock, such as loadlock 401, prior to a photoresist strip operation in one of stations 1, 2, 3, 4, 5, and 6. A robotic blade (not shown) may first move wafers from loadlock 401 to station 1. A wafer transfer device (generally a robot arm unit) in the chamber may move the wafers among the modules or stations within the chamber. Wafers enter the apparatus at station 1 via chamber or loadlock 401, are transferred to each station in sequence for a processing operation at that station and exit from station 6 via chamber or loadlock 402 after the process is complete.

In various embodiments, a system controller 450 is employed to control process conditions during operations. The controller 450 will typically include one or more memory devices and one or more processors. A processor may include a CPU or computer, analog, and/or digital input/output connections, stepper motor controller boards, etc.

The controller 450 may control all of the activities of the deposition apparatus. The system controller 450 executes system control software, including sets of instructions for controlling the timing, flow rates, mixture of gases or vapors, chamber pressure, chamber temperature, wafer temperature, radio frequency (RF) power levels if applicable, wafer chuck or pedestal position, and other parameters of a particular process. Other computer programs stored on memory devices associated with the controller 450 may be employed in some embodiments. Alternatively, the control logic may be hard coded in the controller. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place.

A user interface may be associated with the controller 450. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the one or more hydroxyl-generating compound flows, and carrier gas flow, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, compound vapor composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 450. The signals for controlling the process are output on the analog and digital output connections of the deposition apparatus 400.

The system software may be designed or configured in many different ways. For example, various chamber component subroutines or control objects may be written to control operations of the chamber components necessary to carry out the treatment processes in accordance with the disclosed embodiments. Examples of programs or sections of programs for this purpose include substrate positioning code, process gas control code, pressure control code, and heater control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to treatment in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility.

EXPERIMENTAL

Experiment 1

An experiment was conducted to determine the effect of treating a patterned high-dose ion-implanted (HDI) photoresist with a $H_2O_2/H_2O$ vapor prior to removal as compared to not treating a photoresist prior to removal. A patterned HDI photoresist wafer was processed with $H_2/N_2$ plasma with and without the $H_2O_2/H_2O$ treatment in a process chamber. The $H_2O_2/H_2O$ treatment was performed with a total pressure of 1 atm.

Figure 5A:
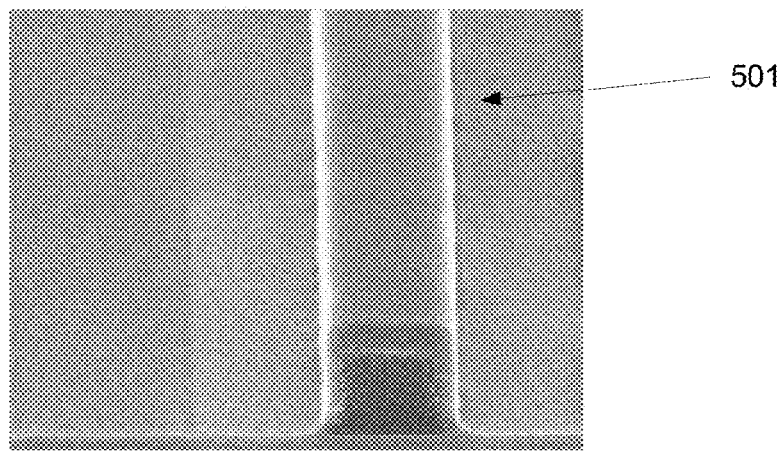
FIGS. 5A and 5B depict SEM images of photoresists on substrates.
Figure 5B:
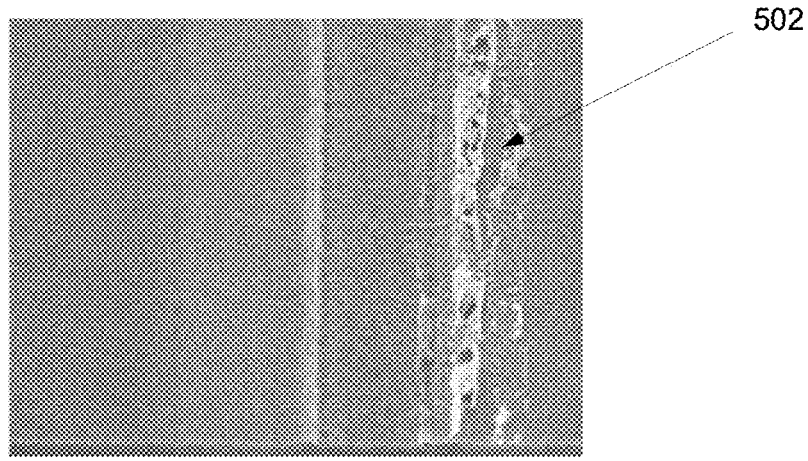
Figure 5C:
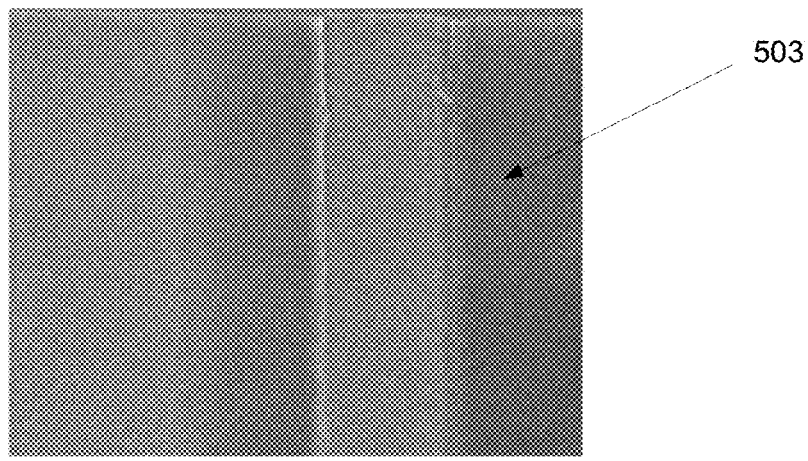
FIG. 5C depicts an SEM image of a photoresist on a substrate in accordance with various embodiments.

FIGS. 5A-5C are scanning electron microscope (SEM) images of wafers. FIG. 5A shows the unprocessed wafer 501, FIG. 5B shows the wafer stripped using $H_2/N_2$ plasma without treatment, and FIG. 5C shows the wafer after treatment with $H_2O_2/H_2O$ vapor followed by a $H_2/N_2$ plasma strip. In FIG. 5B, gross residue 502 is seen after the $H_2/N_2$ plasma strip only, demonstrating the difficulty to remove the crust associated with HDI strip (HDIS) with a non-fluorine-containing plasma. In contrast, performing a $H_2O_2/H_2O$ treatment step before the $H_2/N_2$ plasma was shown to eliminate the residue 503, as shown in FIG. 5C. This finding highlights that the $H_2O_2/H_2O$ vapor treatment step enhances the removal efficiency of the implanted photoresist.

Typically, for HDIS, aggressive fluorine-containing plasmas are conventionally used to strip the implanted photoresist to leave no residue. However, fluorine atoms in the plasma etch silicon, silicon nitride, and silicon oxide quickly, which leads to high material loss. With the introduction of the $H_2O_2/H_2O$ vapor treatment step, however, non-fluorine containing plasmas can be used to strip the implanted photoresist without leaving remaining residue. As seen in FIG. 5C, a non-fluorine-containing plasma ($H_2/N_2$) was used to remove the $H_2O_2/H_2O$ vapor treated photoresist to produce a residue-free surface. In this way, the overall material loss can be suppressed as compared to when fluorine-containing plasmas are used.

Experiment 2

An experiment was conducted to determine the effect of treating a post-plasma doping photoresist with a $H_2O_2$ vapor prior to removal. The effectiveness of the $H_2O_2$ treatment step in significantly improving residue performance was also observed for another application: post-plasma doping photoresist strip. A patterned plasma-doped photoresist sample was treated with 4500 ppm of $H_2O_2$ vapor at 1 atm and then subjected to a mild plasma-strip process using fluorine-free plasma, and it was compared with the sample that was not treated.

In both cases, the sample was plasma processed to remove the implanted photoresist. SEM images of the wafers were analyzed, and the $H_2O_2$ treated sample clearly showed marked residue improvement when compared to the sample that was not treated. The effectiveness of the $H_2O_2/H_2O$ vapor treatment in improving residue performance in various applications, such as beam-line and post-plasma doping photoresist strip, demonstrates the broad applicability of the disclosed embodiments.

Experiment 3

An experiment was conducted to determine the effect of treating with hydrogen peroxide vapor as compared to water vapor prior to photoresist removal. An implanted photoresist sample was treated with 2,700 ppm of $H_2O_2$ and 200,000 ppm of $H_2O$ in a chamber at a total pressure of 1 atm prior to removing the photoresist with a $H_2/N_2$ plasma. Another implanted photoresist sample was treated with 200,000 ppm $H_2O$ vapor only prior to exposure to $H_2/N_2$ plasma. The amount of implanted photoresist removed post plasma exposure was measured by ellipsometry. The results are shown in Table 1 below.

TABLE 1

Photoresist Removed With vs. Without Peroxide

| Treatment Conditions | Removal Amount of Implanted Photoresist (Å) |
|---|---|
| 2700 ppm $H_2O_2$ + 200,000 ppm $H_2O$ | 571.2 |
| 200,000 ppm $H_2O$ only | 493.9 |

As shown, treatment with $H_2O_2/H_2O$ vapor gave rise to a much greater enhancement in the removal of the implanted photoresist during the subsequent plasma-strip process. This finding highlights that the $H_2O_2/H_2O$ treatment process is potentially superior to the $H_2O$-vapor exposure in improving residue performance associated with strip processes. The $H_2O_2/H_2O$ treatment showed much greater enhancement in the removal of the implanted photoresist.

Experiment 4

An experiment was conducted to compare removal rates of hydrogen peroxide-treated photoresists, $H_2O_2/H_2O$-treated photoresists, and $H_2O$-treated photoresists, versus non-treated photoresists. A carrier gas, $N_2$, was used for all wafers. Three high-dose implanted photoresist samples were treated with various concentrations of $H_2O_2$ only at concentrations of 550 ppm, 4574 ppm, and 100,000 ppm. One HDI photoresist sample was treated with 2,700 ppm of $H_2O_2$ and 200,000 ppm of $H_2O$. One HDI photoresist sample was treated with 200,000 ppm of $H_2O$. Each wafer was subsequently stripped using plasma of oxygen ($O_2$) and forming gas (FG), which is a mixture of 4% $H_2$ in $N_2$. As a control, the same high-dose implanted photoresist sample was treated with nitrogen ($N_2$) gas and then stripped using the $O_2$/FG plasma. The amount of implanted photoresist that was removed for each sample was measured by ellipsometry. The amounts of implanted photoresist removed are plotted in FIG. 6.

Figure 6:
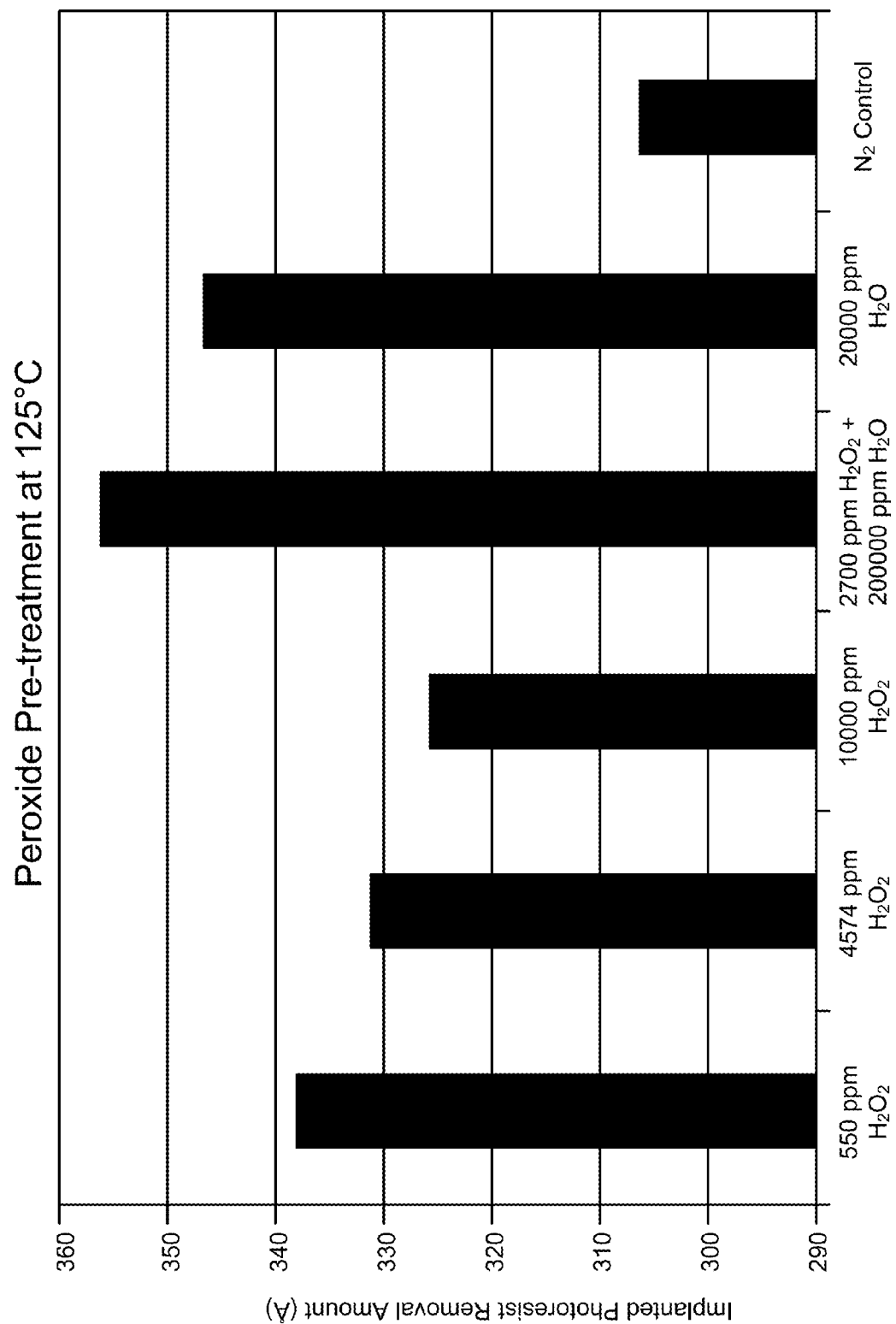
FIG. 6 is a graph showing experimental results in accordance with disclosed embodiments.

FIG. 6 shows that the samples treated with $H_2O_2$ only and $H_2O_2/H_2O$ vapor led to higher removal rates of the implanted photoresist when compared to the control sample that was treated with $N_2$.

Without being bound by any particular theory, it is believed that the improvement in the residue performance by performing a $H_2O_2/H_2O$ vapor treatment before the plasma process may be attributed to the modifications that the $H_2O_2/H_2O$ vapor introduces into the implanted photoresist. These modifications may accelerate and/or enhance the removal of the implanted photoresist during the subsequent plasma-processing step. A combination of $H_2O_2/H_2O$ vapor also may have enhanced implanted photoresist removal when compared to the $N_2$ control and the $H_2O$-only treated sample. The $H_2O$-only treated sample also exhibited a higher removal than the $N_2$ control. All of the treated samples showed enhancement in the removal rate of the implanted photoresist when compared to the $N_2$-treated control sample.

Experiment 5

Figure 7A:
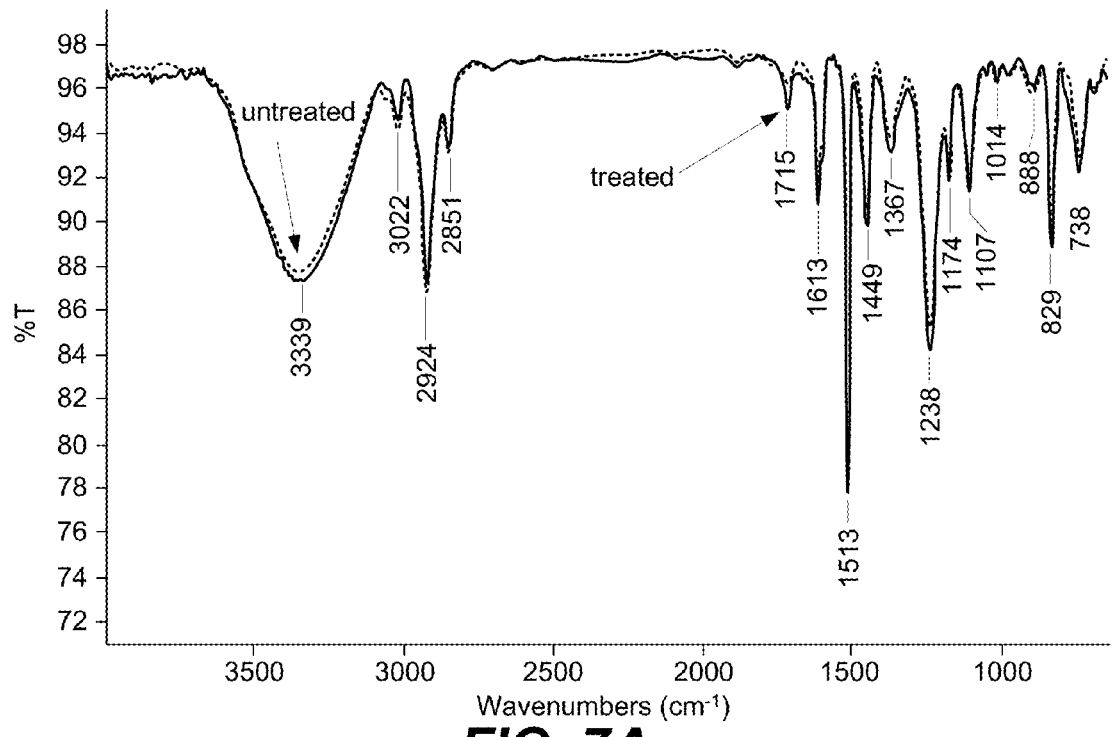
FIGS. 7A and 7B are Fourier transform infrared spectroscopy spectrums for photoresists in accordance with various embodiments.
Figure 7B:
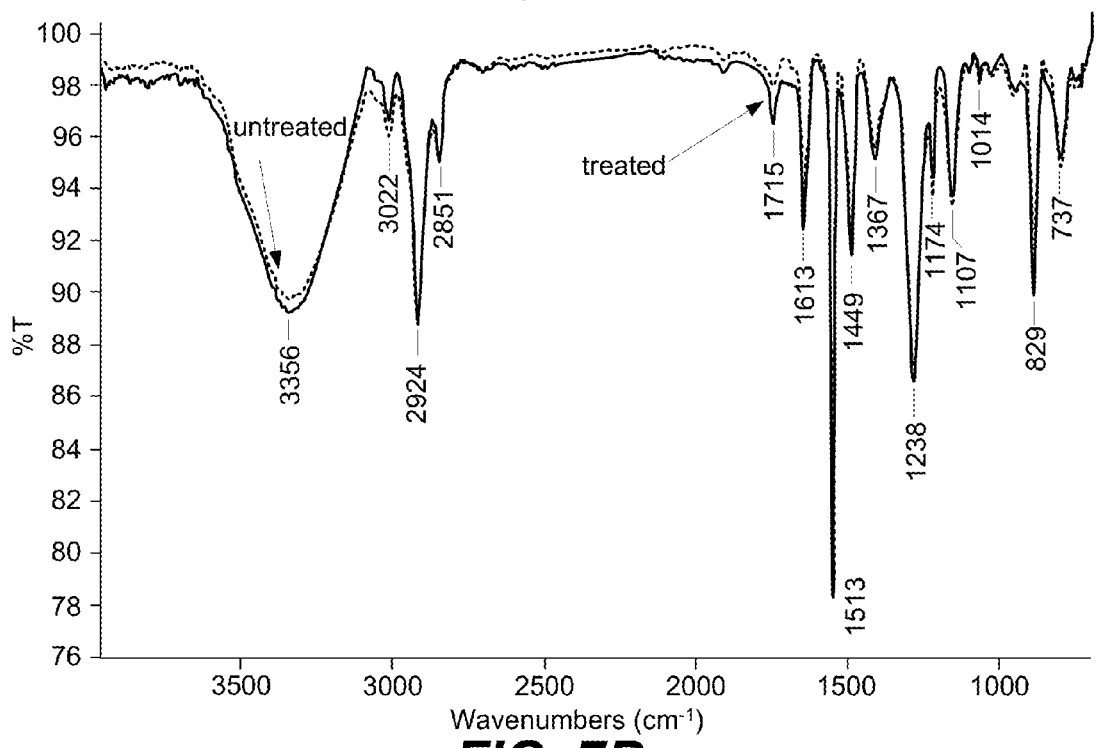

An experiment was conducted to evaluate the chemical composition of treated versus untreated photoresists. Implanted photoresist samples were exposed to $H_2O_2$ vapor only or a mixture of $H_2O_2$ and $H_2O$ vapor, and the samples were then analyzed by Fourier transform infrared spectroscopy (FTIR). The resulting FTIR spectroscopy data is depicted in FIG. 7. As shown in FIG. 7A, the data for the untreated photoresist is shown as a dotted line, and the data for the $H_2O_2$-treated photoresist is depicted as a solid line. In FIG. 7B, the data for the untreated photoresist is depicted as a dotted line, and the data for the $H_2O_2/H_2O$-treated photoresist is depicted as a solid line.

Both the $H_2O_2$ and $H_2O_2/H_2O$-treated photoresist samples show an increase in the intensity of the carbonyl peak at 1715 cm$^{-1}$ relative to the untreated implanted photoresist sample (control), suggesting that, without being bound by any particular theory, the $H_2O_2$ exposure chemically modified the implanted photoresist. The increased carbonyl content may indicate that the polymer chains have been oxidized by the $H_2O_2$ exposure. This chemical modification may in turn favorably affect the ability of the subsequent plasma strip process to remove the implanted photoresist.

Aside from chemical modifications to the implanted photoresist, it is believed that the $H_2O_2/H_2O$ vapor also physically modified the implanted photoresist. Such physical modifications may include the fragmentation of the polymer chain to produce chain fragments with a smaller molecular weight and the creation of channels or voids in the crust layer. Both phenomena may enhance the removal rate of implanted photoresist during the subsequent plasma-processing step, which would in turn augment residue performance and throughput.

Experiment 6

An experiment was conducted to determine the effect of the treatment on material loss. Substrates were treated with $H_2O_2/H_2O$ at various conditions prior to their exposure to a $H_2/N_2$-plasma strip. The substrates used were low pressure chemical vapor deposition (LPCVD)-$Si_3N_4$, thermal $SiO_2$, and bare Si with the naturally occurring native oxide. The removal amount (i.e., material loss) corresponding to each type of substrate was measured at the end of the $H_2/N_2$-plasma strip process. This removal amount corresponds to material loss that is attributed to both the $H_2O_2/H_2O$ treatment step and the $H_2/N_2$-plasma strip. Control samples, which correspond to substrates that were not treated with $H_2O_2/H_2O$ were exposed to the $H_2/N_2$ plasma only (the treatment step was omitted). Therefore, the material loss associated with the control sample is solely attributed to the $H_2/N_2$ plasma. Any significant difference from this control value must be the loss attributed to the $H_2O_2/H_2O$ treatment step. In this experiment, the substrates were treated with conditions that fall in the process regime where residue improvement had been observed on the implanted wafers.

FIGS. 8A-8C depict bar graphs of the removal amounts for various conditions of treatment. Control samples correspond to substrates that were not treated with $H_2O_2/H_2O$, and were exposed to $H_2/N_2$ plasma only for 5 min at 150° C. Negative removal amounts refer to deposition or growth on the wafers post processing.

In FIG. 8A, the substrates were treated with 2700 ppm of $H_2O_2$ and 200,000 ppm of $H_2O$. The $H_2O_2$ and $H_2O$ concentrations during the treatment step were kept constant, while the temperature was varied between 75° C. and 250°

C. Silicon nitride ($Si_3N_4$) loss due to the $H_2O_2/H_2O$ treatment was found to be negligible at about 0.7 Å in thickness, and was invariant with temperature. The control showed that Si was oxidized by the $H_2/N_2$ plasma at 150° C. for 5 min, resulting in about 5 Å growth of the oxide layer. The growth in oxide layer implies that Si is consumed and reacted with the O atoms to form $SiO_2$. The Si samples that were treated with the $H_2O_2/H_2O$ also showed a comparable oxide growth with that of the control sample that was processed with the $H_2/N_2$ plasma strip only at 150° C. for 5 min, indicating that the treatment step did not incur additional Si loss. The thermal oxide samples that were treated showed a slight oxide deposition of less than 2 Å, while the plasma-treated control showed a negligible oxide removal. The slight deposition could have been attributed to measurement error caused by surface contaminants present on the wafer surface and/or the inherent metrology uncertainty associated with measuring such a small change in oxide-film thickness.

For the substrates in FIG. 8B, substrates were treated with 2700 ppm of $H_2O_2$. For the substrates in FIG. 8C, the substrates were treated with various concentrations of $H_2O_2$ (550 ppm, 2700 ppm, 100000 ppm) at a fixed temperature of 125° C. These substrates were then exposed to the $H_2/N_2$ plasma at 150° C. for 5 min. In these cases, $Si_3N_4$ loss due to the $H_2O_2$ treatment was also negligible (less than ±1 Å). Note that in FIGS. 8B and 8C, the $Si_3N_4$ loss was measured to be zero for the treatment that was done with 2,700 ppm $H_2O_2$ at 125° C. Generally, the Si oxidation was measured to be comparable with that of the control sample, indicating that the $H_2O_2$ treatment did not induce Si loss. The treated thermal oxide samples showed slight deposition or loss that is likely to be attributed to measurement error. Note that in FIG. 8C, the thermal oxide loss for the sample that was treated with 550 ppm $H_2O_2$ at 125° C. was measured to be zero. Overall, the treatment incurred negligible material loss for all of the above three substrates.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of removing an organic film from a substrate, comprising:
   exposing the organic film to hydrogen peroxide vapor to modify the organic film under non-plasma conditions at a chamber pressure between 0.6 Torr and 760 Torr; and
   after exposing the organic film to the hydrogen peroxide vapor, exposing the organic film to a plasma to remove the organic film.

2. The method of claim 1, wherein the plasma is substantially fluorine-free.

3. The method of claim 1, wherein the substrate further comprises one or more exposed surfaces having no organic film thereon, and wherein the exposure results in substantially no material loss from the one or more exposed surfaces.

4. The method of claim 1, wherein the exposure chemically or physically modifies the organic film.

5. The method of claim 1, wherein the organic film comprises photoresist comprising bulk photoresist encapsulated by a crust, and wherein the crust has properties different from the bulk photoresist.

6. The method of claim 5, wherein the photoresist is an ion-implanted photoresist.

7. A method of removing an organic film on a semiconductor substrate, comprising:
   exposing a substrate with the organic film thereon to one or more hydroxyl-generating gases under conditions that prevent condensation of the one or more hydroxyl-generating gases to generate hydroxyl groups that chemically or physically modify the organic film and thereby treat the organic film,
   wherein the exposure is performed prior to removing the organic film,
   wherein the exposure is performed at a chamber pressure between about 0.6 Torr and about 760 Torr, and
   wherein the exposure is performed in a non-plasma environment.

8. The method of claim 7, wherein the organic film is photoresist.

9. The method of claim 7, wherein the one or more hydroxyl-generating gases comprise hydrogen peroxide vapor.

10. The method of claim 7, wherein the one or more hydroxyl-generating gases comprise water vapor.

11. The method of claim 7, wherein the one or more hydroxyl-generating gases comprise hydrogen peroxide vapor and water vapor.

12. The method of claim 7, further comprising, after treating the organic film, exposing the substrate to a plasma to thereby remove the organic film.

13. The method of claim 12, wherein the plasma is substantially fluorine-free.

14. The method of claim 12, wherein the plasma is generated from forming gas.

15. The method of claim 8, wherein the substrate having the photoresist thereon further comprises one or more exposed surfaces having no photoresist thereon, and wherein the exposure results in substantially no material loss from the one or more exposed surfaces.

16. The method of claim 7, further comprising exposing the one or more hydroxyl-generating gases to ultra-violet radiation.

17. The method of claim 16, wherein the one or more hydroxyl-generating gases are exposed to ultra-violet radiation in a chamber housing the substrate.

18. The method of claim 8, wherein the photoresist comprises bulk photoresist encapsulated by a crust, and wherein the crust has properties different from the bulk photoresist.

19. The method of claim 8, wherein the photoresist is an ion-implanted photoresist.

20. The method of claim 7, wherein the partial pressure of the one or more hydroxyl-generating gases is between about 225 ppm and about 10000 ppm.

* * * * *